(12) United States Patent
Kim et al.

(10) Patent No.: US 11,450,618 B2
(45) Date of Patent: Sep. 20, 2022

(54) SEMICONDUCTOR DEVICE AND METHOD OF COMPARTMENT SHIELDING USING BOND WIRES

(71) Applicant: STATS ChipPAC Pte. Ltd., Singapore (SG)

(72) Inventors: YoungCheol Kim, Gyeonggi-do (KR); ChoonHeung Lee, Singapore (SG); WonGyou Kim, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 17/032,005

(22) Filed: Sep. 25, 2020

(65) Prior Publication Data
US 2021/0225778 A1 Jul. 22, 2021

Related U.S. Application Data

(60) Provisional application No. 62/962,288, filed on Jan. 17, 2020.

(51) Int. Cl.
| | |
|---|---|
| *H01L 23/522* | (2006.01) |
| *H01L 23/552* | (2006.01) |
| *H01L 23/31* | (2006.01) |
| *H01L 21/56* | (2006.01) |
| *H01L 23/498* | (2006.01) |
| *H01L 23/00* | (2006.01) |
| *H01L 21/48* | (2006.01) |
| *H01L 23/49* | (2006.01) |

(52) U.S. Cl.
CPC ........ *H01L 23/552* (2013.01); *H01L 21/4853* (2013.01); *H01L 21/4889* (2013.01); *H01L 21/565* (2013.01); *H01L 23/3121* (2013.01); *H01L 23/49* (2013.01); *H01L 23/49838* (2013.01); *H01L 24/16* (2013.01); *H01L 2224/16227* (2013.01); *H01L 2924/3025* (2013.01)

(58) Field of Classification Search
None
See application file for complete search history.

(56) References Cited

U.S. PATENT DOCUMENTS

| | | | |
|---|---|---|---|
| 6,350,951 B1 | 2/2002 | Askew | |
| 8,399,972 B2 | 3/2013 | Hoang et al. | |
| 9,490,222 B1 | 11/2016 | Awujoola et al. | |
| 2018/0240759 A1* | 8/2018 | Haji-Rahim | ........ H01L 23/3121 |
| 2020/0066547 A1* | 2/2020 | Huemoeller | ........ H01L 23/3121 |

* cited by examiner

*Primary Examiner* — Long Pham
(74) *Attorney, Agent, or Firm* — Robert D. Atkins; Patent Law Group: Atkins and Associates, P.C.

(57) ABSTRACT

A semiconductor device has a substrate and a plurality of bond wires is disposed in a pattern across on the substrate. The pattern of bond wires can be a plurality of rows of bond wires. A plurality of electrical components is disposed over the substrate as an SIP module. An encapsulant is deposited over the substrate, electrical components, and bond wire. An opening is formed in the encapsulant extending to the bond wire. The opening can be a trench extending across the bond wires disposed on the substrate, or a plurality of openings individually exposing each of a plurality of bond wires. A conductive material is disposed in the opening. A shielding layer is formed over the encapsulant and in contact with the conductive material. The shielding layer, conductive material, and bond wires reduce the effects of EMI, RFI, and other inter-device interference.

23 Claims, 21 Drawing Sheets

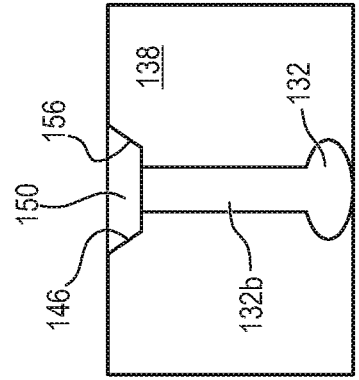
FIG. 3a
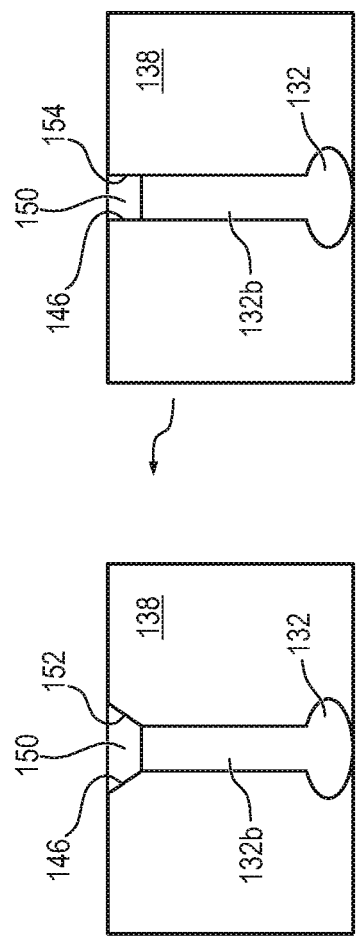
FIG. 3b
FIG. 3c
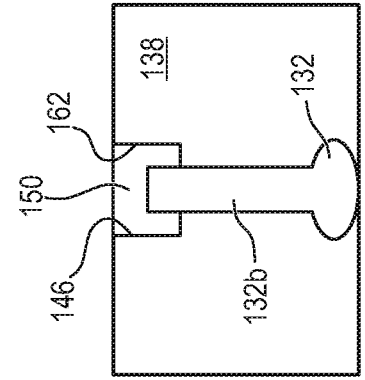
FIG. 3d
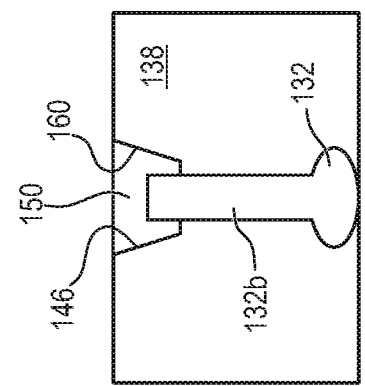
FIG. 3e
FIG. 3f

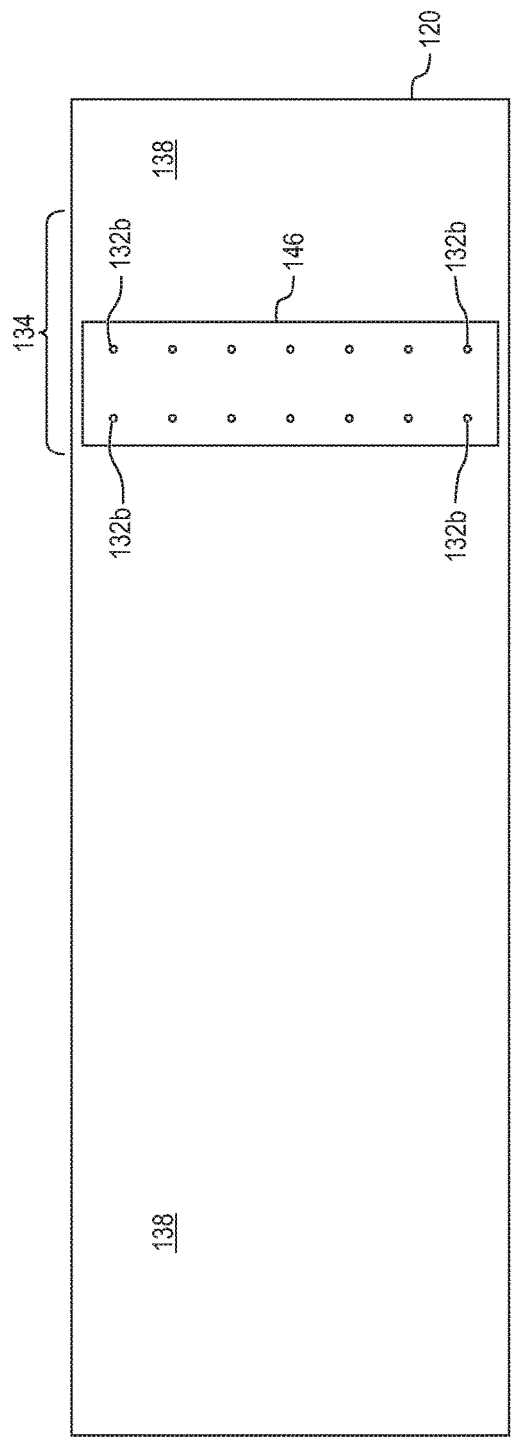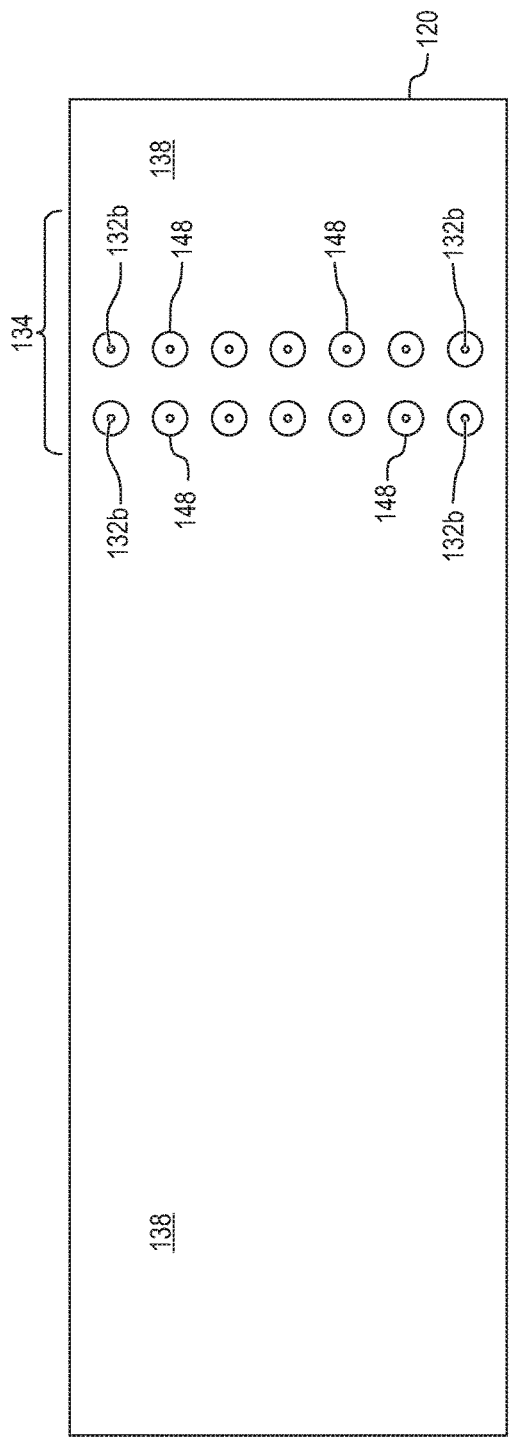

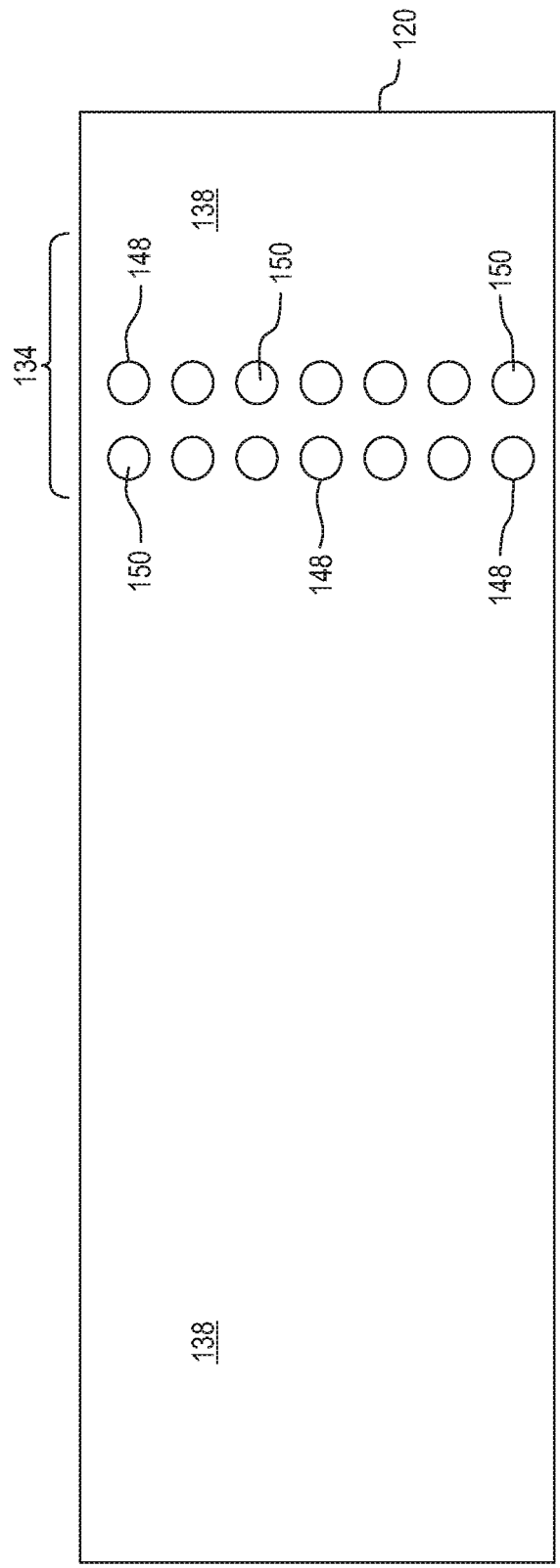

SEMICONDUCTOR DEVICE AND METHOD OF COMPARTMENT SHIELDING USING BOND WIRES

CLAIM TO DOMESTIC PRIORITY

The present application claims the benefit of U.S. Provisional Application No. 62/962,288, filed Jan. 17, 2020, which application is incorporated herein by reference.

FIELD OF THE INVENTION

The present invention relates in general to semiconductor devices and, more particularly, to a semiconductor device and method of forming a shielding layer in contact with bond wires disposed between electrical components to form compartmentalize shielding in an system-in-package (SIP) module.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particular in high frequency applications, such as radio frequency (RF) wireless communications, often contain one or more integrated passive devices (IPDs) to perform necessary electrical functions. The IPDs are susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generate interference.

Multiple semiconductor die and discrete IPDs can be integrated into a system-in-package (SIP) module for higher density in a small space and extended electrical functionality. Within the SIP module, semiconductor die and discrete IPDs are mounted to a substrate for structural support and electrical interconnect. An encapsulant is deposited over the semiconductor die, discrete IPDs, and substrate. A shielding layer is formed over the encapsulant to isolate sensitive circuits. In many applications, the encapsulant must be planarized with a grinder in order to make a good connection for the shielding layer. The grinding operation increases manufacturing costs.

BRIEF DESCRIPTION OF THE DRAWINGS

FIGS. 3a-3f illustrate various shapes of the opening used to expose the bond wire;

FIGS. 4a-4k illustrate a process of forming a shielding layer in contact with multiple rows of bond wires disposed between electrical components in an SIP module;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
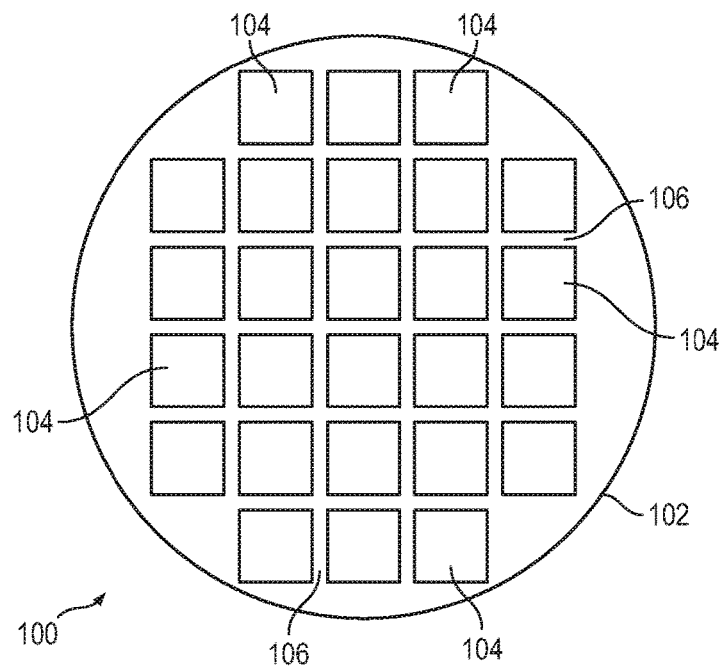
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
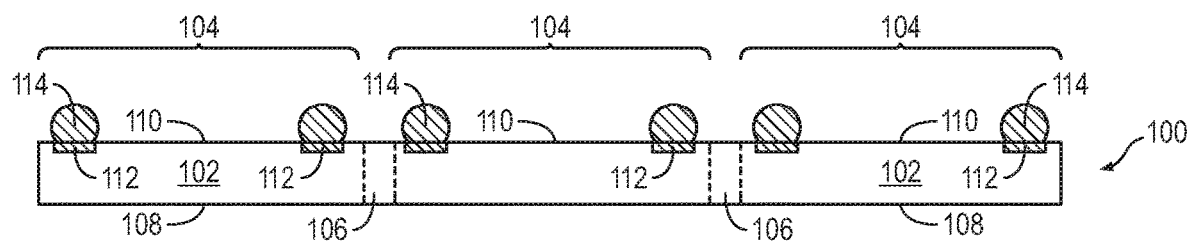

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed overactive surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
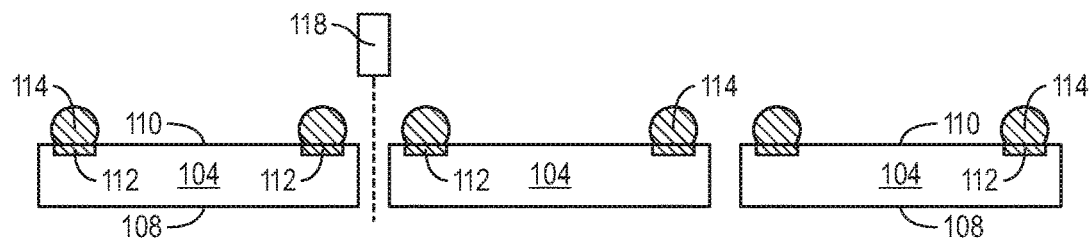

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
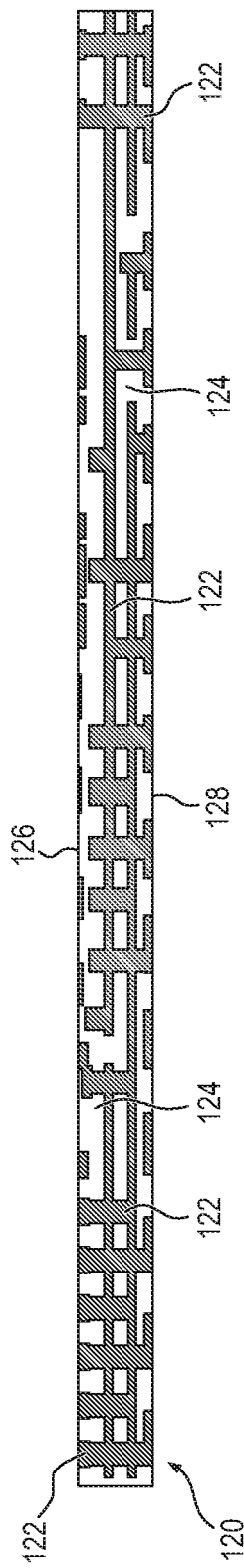
FIGS. 2a-2m illustrate a process of forming a shielding layer in contact with bond wires disposed between electrical components in an SIP module.

FIGS. 2a-2m illustrate a process of forming a shielding layer in direct contact with bond wires disposed between electrical components in an SIP module. FIG. 2a shows a cross-sectional view of substrate 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122.

Figure 2B:
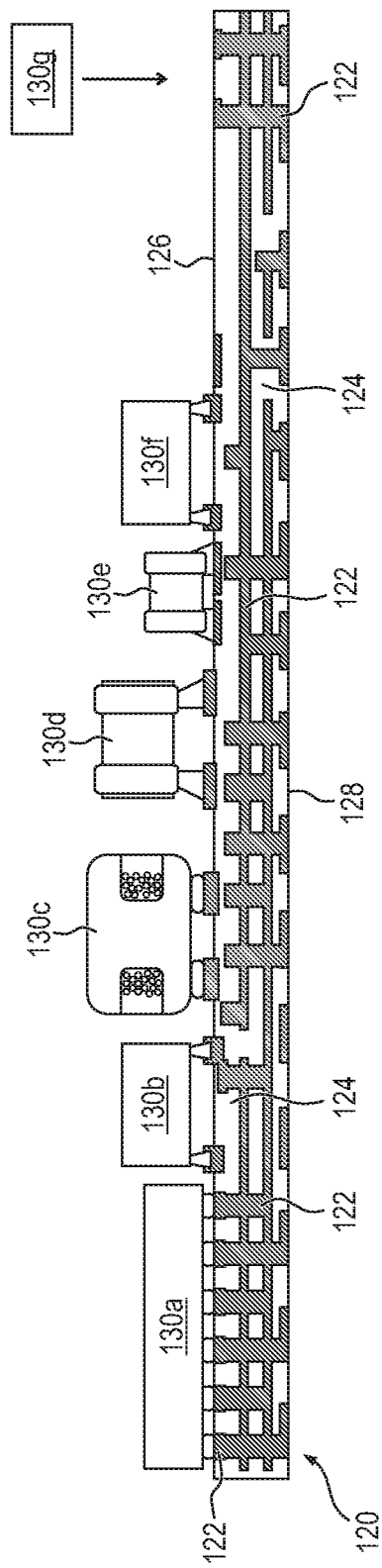

In FIG. 2b, a plurality of electrical components 130a-130g is mounted to substrate 120 and electrically and mechanically connected to conductive layers 122. Electrical components 130a-130g are each positioned over substrate 120 using a pick and place operation. For example, electrical component 130a can be semiconductor die 104 from FIG. 1c with active surface 110 and bumps 114 oriented toward surface 126 of substrate 120. Alternatively, electrical components 130a-130g can include other semiconductor die, semiconductor packages, surface mount devices, discrete electrical devices, or IPDs, such as a resistor, capacitor, and inductor. Electrical components 130a-130g are reflowed to make mechanical and electrical connection to conductive layer 122, as shown in FIG. 2c.

Figure 2C:
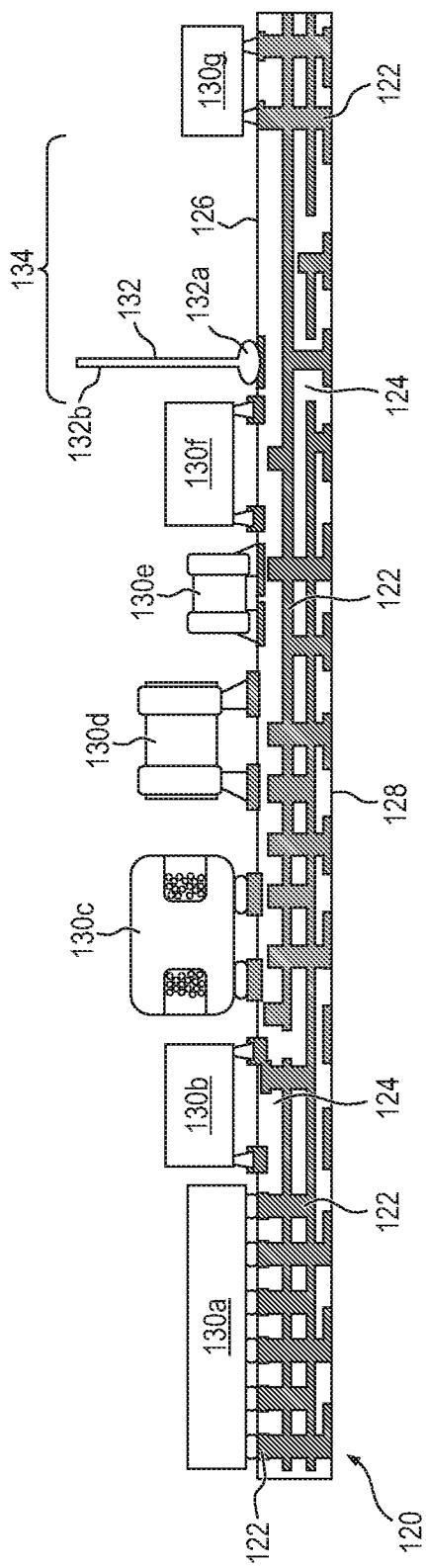
Figure 2D:
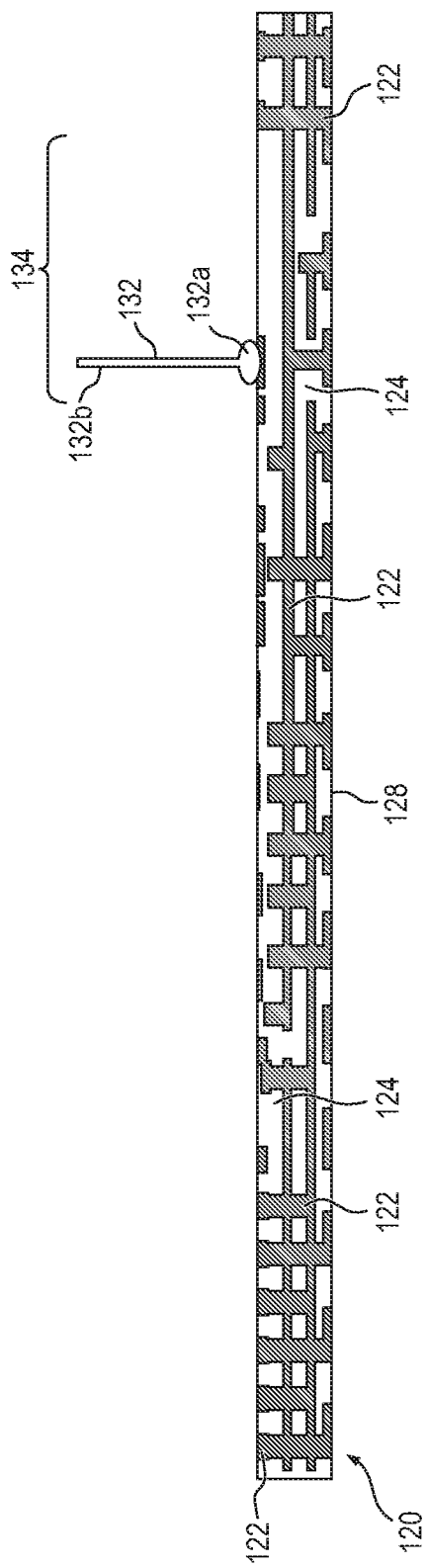
Figure 2E:
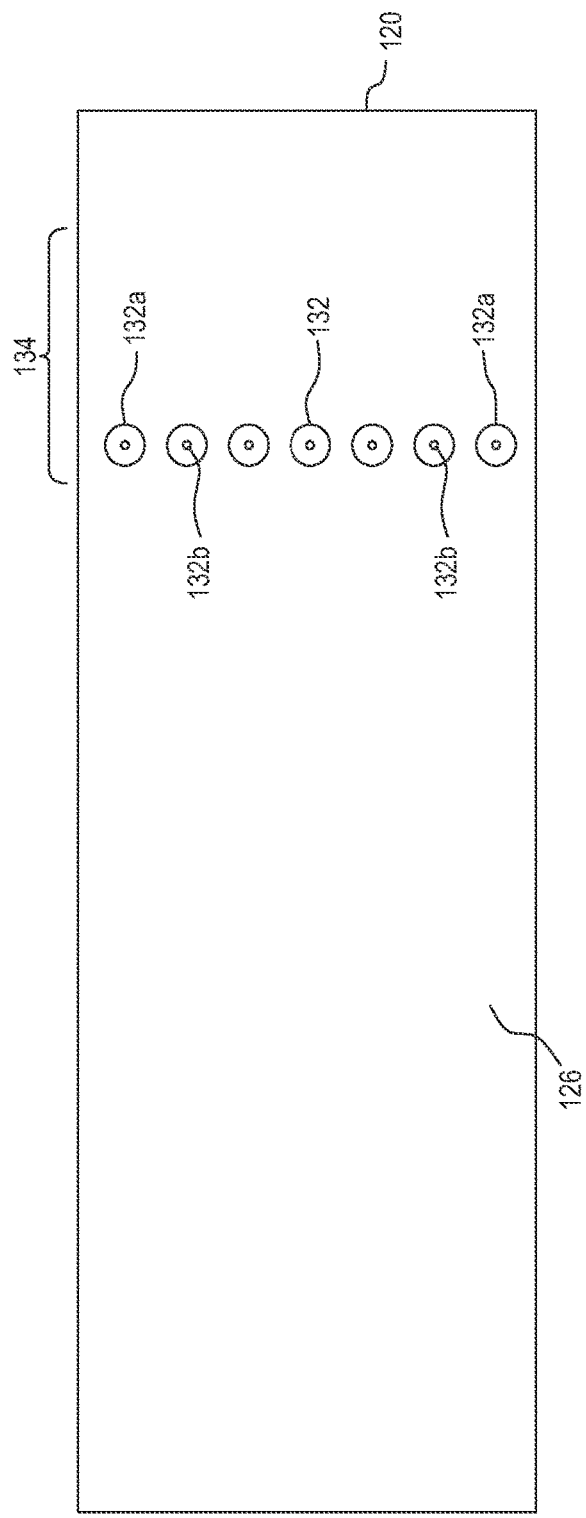

As a feature of the SIP module, a plurality of bond wires 132 is formed in a pattern across bond wire attach area 134 of FIG. 2c. Bond wires 132 can be Al, Cu, Sn, Ni, Au, Ag, or other suitable electrically conductive material. Each bond wire 132 has a bulbous or rounded portion 132a and stem portion 132b. The bulbous portion 132a can be formed by pressing a straight wire, heated to its melting point, into conductive layer 122. The bulbous portion 132a is thus bonded to conductive layer 122, leaving stem portion 132b extending from the bulbous portion. FIG. 2c shows bond wire 132 formed after mounting electrical components 130a-130g to substrate 120. In another embodiment, bond wire 132 is formed within bond wire attach area 134 on substrate 120 prior to mounting electrical components 130a-130g, as shown in FIG. 2d. In one embodiment, bond wires 132 can be formed as a row within bond wire attach area 134 on substrate 120, prior to mounting electrical components 130a-130g. FIG. 2e shows an orthogonal view of a row of bond wires 132 formed within bond wire attach area 134 on surface 126 of substrate 120 prior to mounting electrical components 130a-130g. Electrical components 130a-130g are mounted after forming bond wires 132, resulting in an interim SIP module similar to FIG. 2c.

Figure 2F:
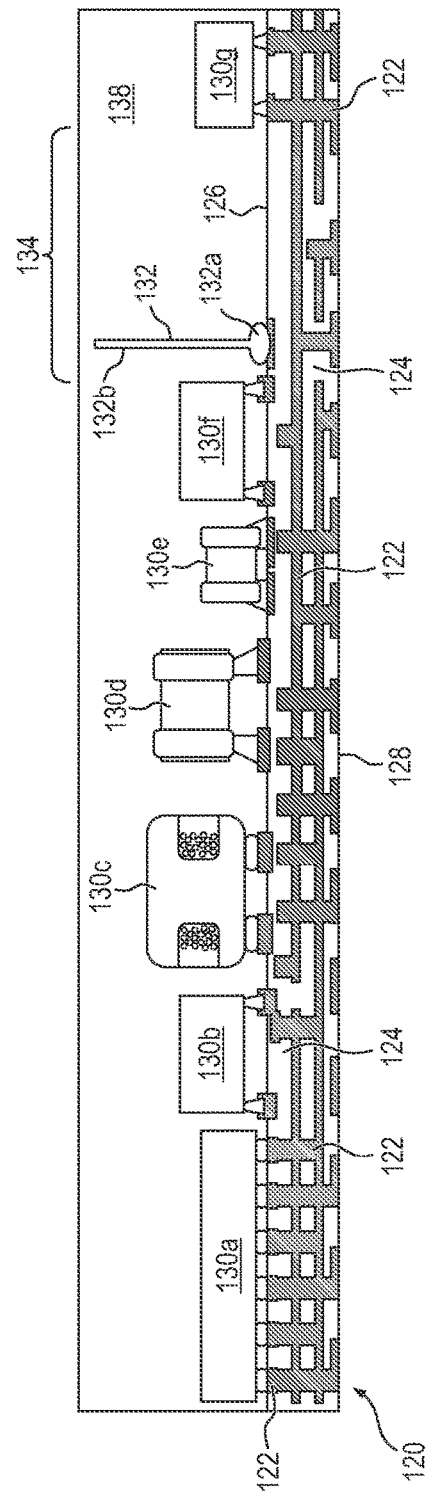

In FIG. 2f, an encapsulant or molding compound 138 is deposited over electric components 130a-103g, bond wires 132, and substrate 120 using a paste printing, compressive molding, transfer molding, liquid encapsulant molding, vacuum lamination, spin coating, or other suitable applicator. Encapsulant 138 can be polymer composite material, such as epoxy resin with filler, epoxy acrylate with filler, or polymer with proper filler. Encapsulant 138 is non-conductive, provides structural support, and environmentally protects the semiconductor device from external elements and contaminants. In particular, encapsulant 138 is deposited over electric components 130a-103g, bond wires 132, and substrate 120 after bonding the bond wires and electrical components to the substrate. Encapsulant 138 is deposited with a sufficient thickness to cover bond wires 132.

Figure 2G:
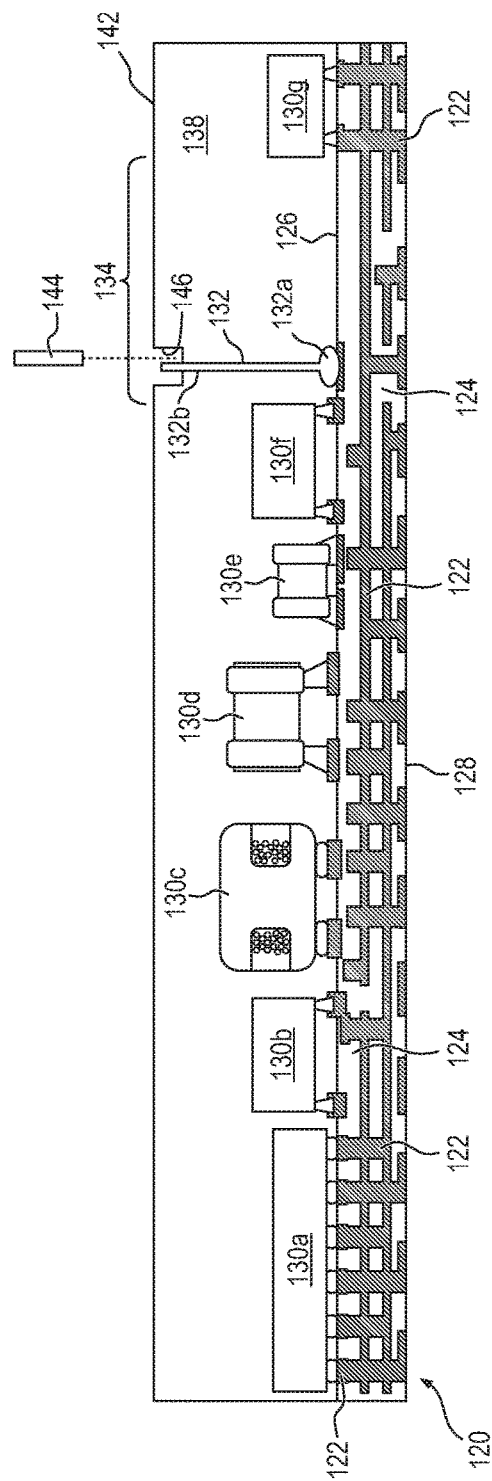
Figure 2H:
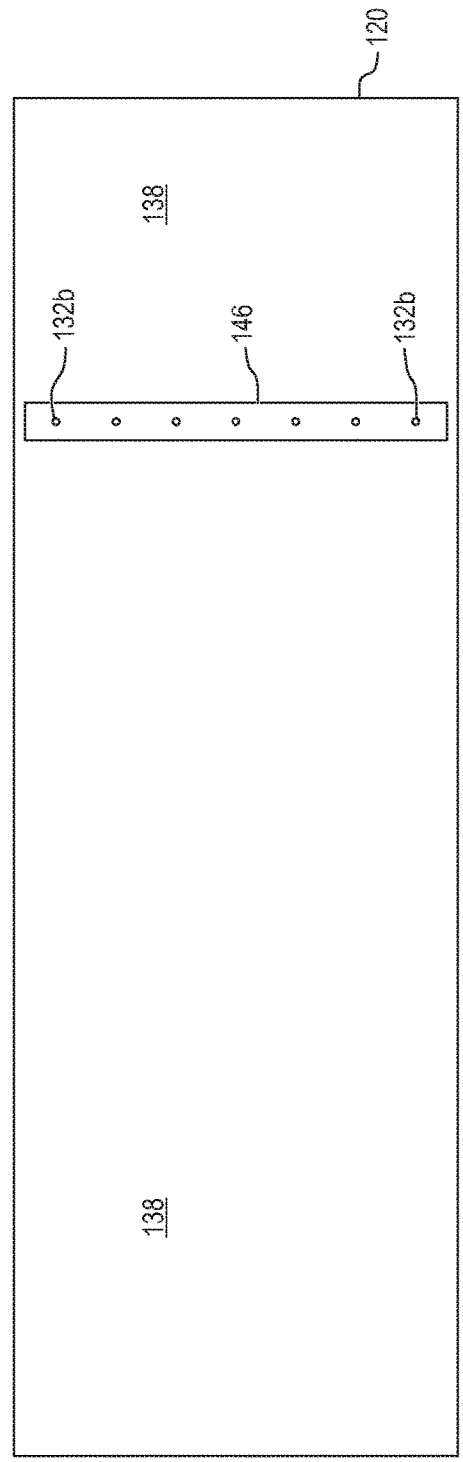
Figure 2I:
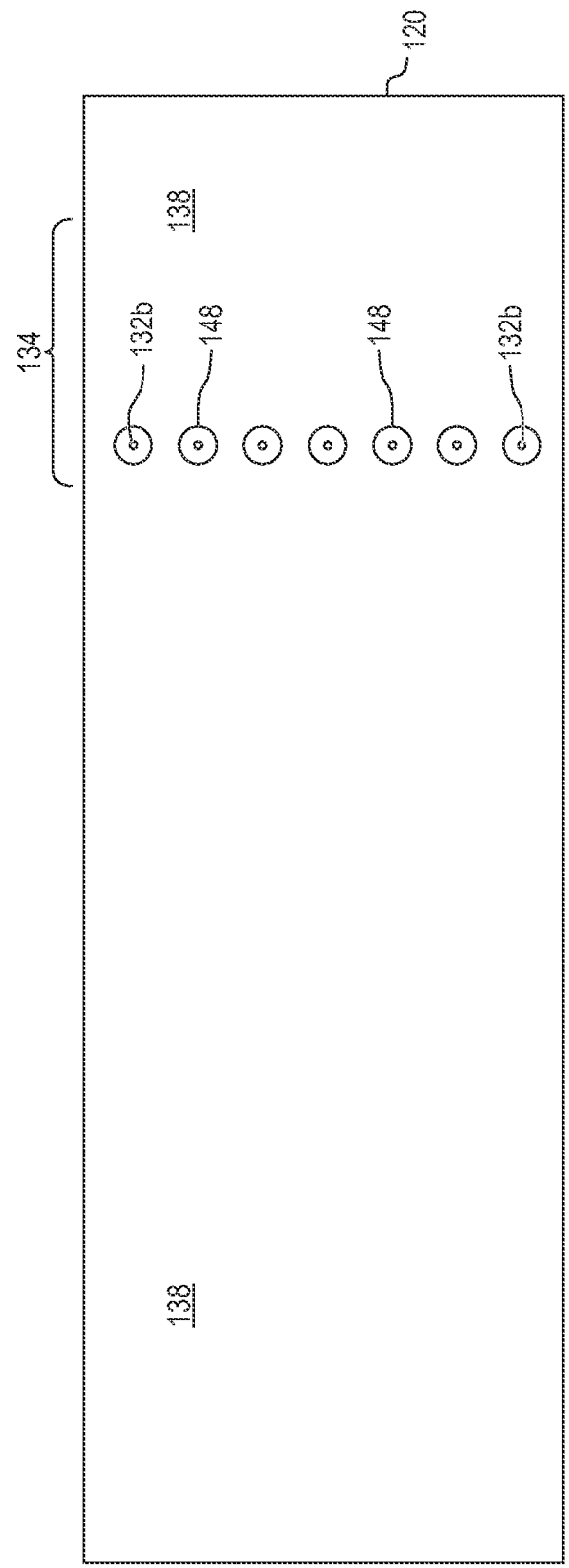

In FIG. 2g, a portion of encapsulant 138 is removed by an etching process, mechanical sawing, or laser direct ablation (LDA) using laser 144 to form trench or opening 146 extending substantially across or completely across substrate 120. The depth of trench 146 is sufficient to expose side surfaces of stem portion 132b. Trench 146 can have vertical or beveled side surfaces. FIG. 2h shows an orthogonal view of trench 146 formed in encapsulant 138 with exposed stem portion 132b of bond wire 132 within the trench. In another embodiment, individual openings 148 are formed over each stem portion 138b of bond wire 132 by LDA. FIG. 2i shows an orthogonal view of encapsulant 138 with exposed stem portion 132b of bond wire 132 through individual openings 148.

Figure 2J:
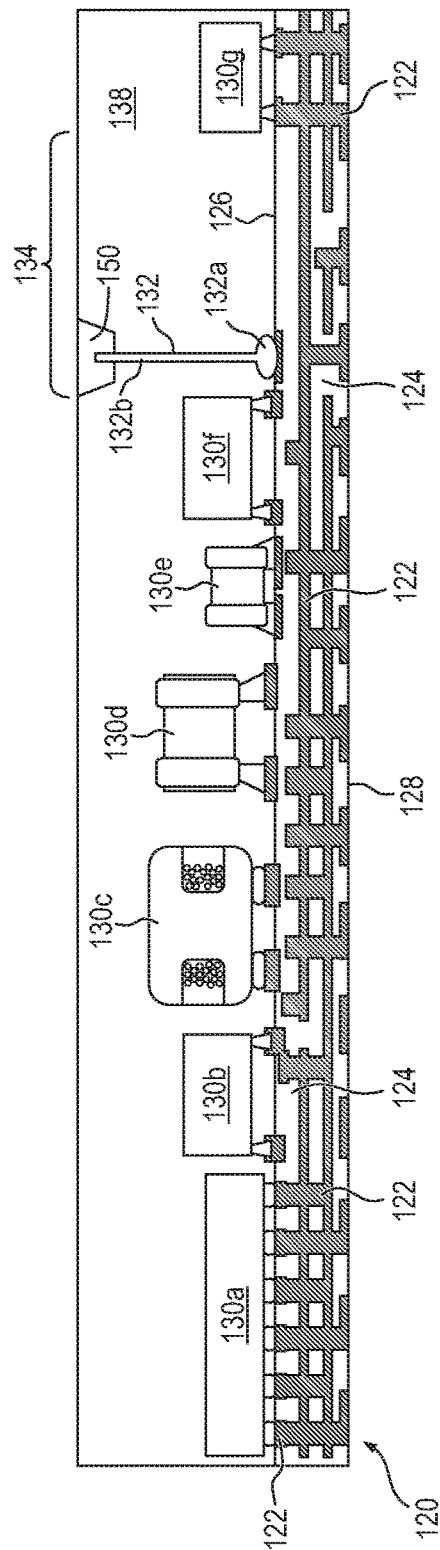
Figure 2K:
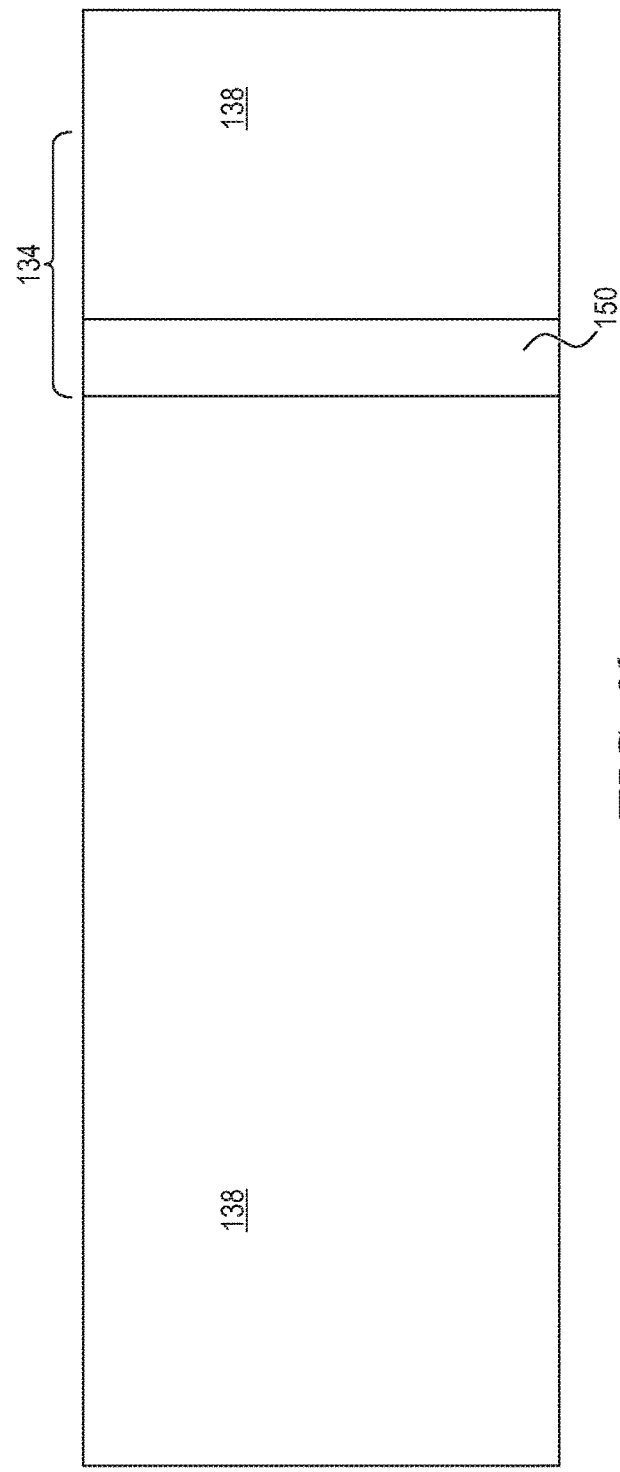
Figure 2L:
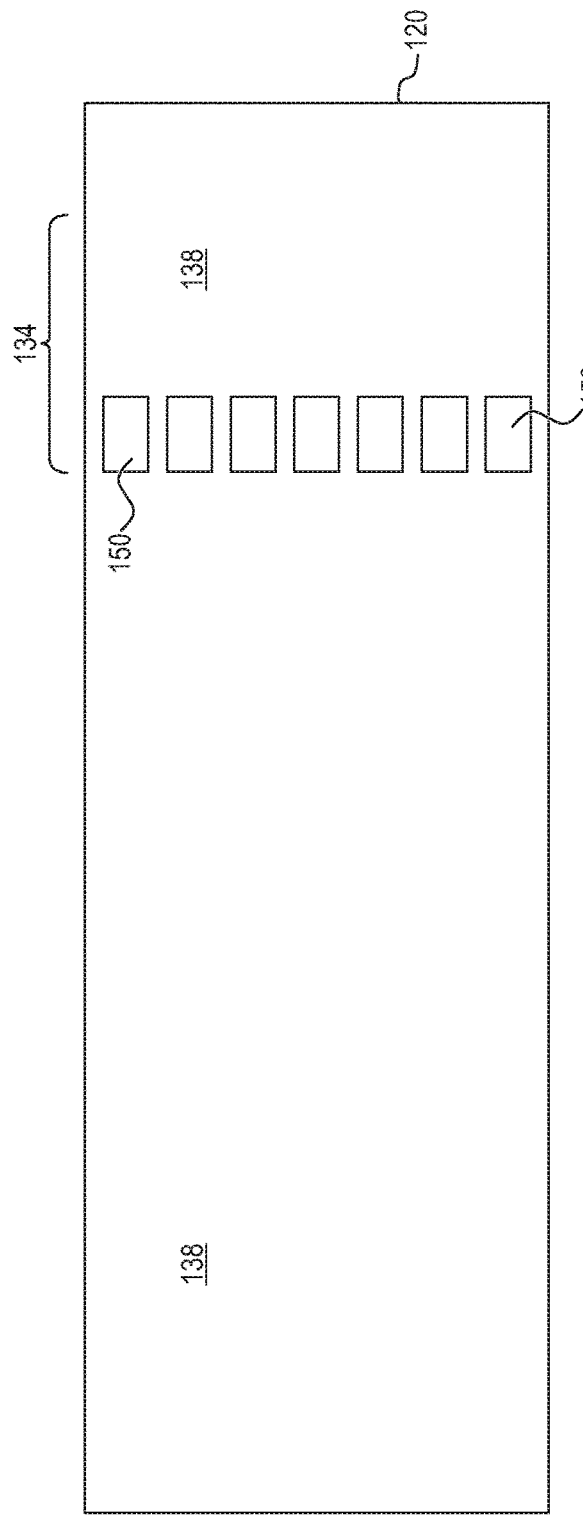

In FIG. 2j, conductive paste 150 is deposited into trench 146. In one embodiment, conductive paste 150 is solder paste. FIG. 2k shows an orthogonal view of conductive paste 150 in trench 146 extending substantially across or completely across substrate 120 to contact the row of stem portions 132b. The side surfaces of stem portion 132b extends into trench 146, i.e. above the bottom surface of the trench, to expose more of the stem portion into conductive paste 150 for additional electrical contact surface area of the side surface of the stem portion. FIG. 2l shows an orthogonal view of conductive paste 150 in openings 148 to individual contact each stem portion 132b within the row, in accordance with FIG. 2i.

FIGS. 3a-3f show a variety of types of openings 146 filled with conductive paste 150. FIG. 3a shows beveled side surfaces 152 of trench 146 extending to a top surface of stem portion 132b. FIG. 3b shows vertical side surfaces 154 of trench 146 extending to a top surface of stem portion 132b and within a footprint of stem portion 132b. FIG. 3c shows beveled side surfaces 156 of trench 146 extending to a top surface of stem portion 132b. Trench 146 extends outside a footprint of stem portion 132b. FIG. 3d shows vertical side surfaces 158 of trench 146 extending to a top surface of stem portion 132b. Trench 146 extends outside a footprint of stem portion 132b. FIG. 3e shows beveled side surfaces 160 of trench 146 extending below a top surface of stem portion 132b, leaving a side surface of stem portion 132b exposed within trench 146. Trench 146 extends outside a footprint of stem portion 132b. FIG. 3f shows vertical side surfaces 162 of trench 146 extending below a top surface of stem portion 132b, leaving a side surface of stem portion 132b exposed within trench 146. Trench 146 extends outside a footprint of stem portion 132b. FIGS. 3e and 3f are similar to the embodiment of FIG. 2j with the exposed side surface of stem portion 132b increasing the electrical contact surface area with the side surfaces of the stem portion.

Electrical components 130a-130g may contain IPDs that are susceptible to or generate EMI, RFI, harmonic distortion, and inter-device interference. For example, the IPDs contained within electrical components 130a-130g provide the electrical characteristics needed for high-frequency applications, such as resonators, high-pass filters, low-pass filters, band-pass filters, symmetric Hi-Q resonant transformers, and tuning capacitors. In another embodiment, electrical components 130a-130g contains digital circuits switching at a high frequency, which could interfere with the operation of IPDs in the SIP module.

Figure 2M:
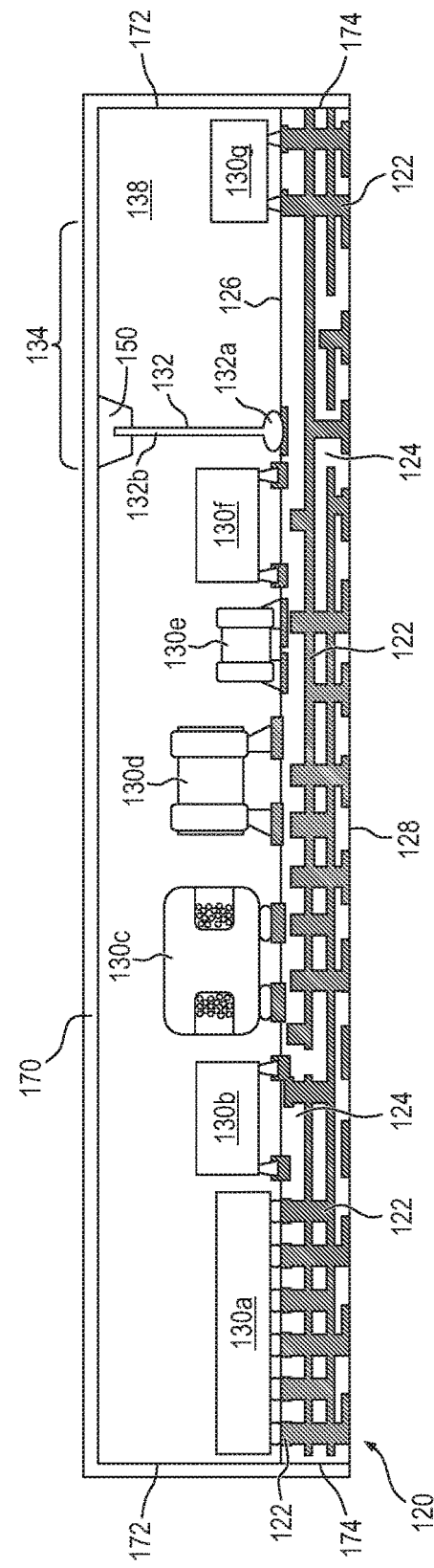

Continuing from FIG. 2l, an electromagnetic shielding layer 170 is formed or disposed over surface 142 of encapsulant 138 and conductive paste 150 within trench 146, as shown in FIG. 2m. Shielding layer 170 can be one or more layers of Al, Cu, Sn, Ni, Au, Ag, or other suitable conductive material. Alternatively, shielding layer 170 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference. Conductive paste 150 is reflowed to make electrical connection between shielding layer 170 and bond wire 132. In particular, shielding layer 170 uses trench 146 or openings 148 and conductive paste 150 to make electrical contact to bond wire 132 for an external ground. In addition, shielding layer 170 covers side surfaces 172 of encapsulant 138 and side surfaces 174 of substrate 120.

SIP module 176 containing electrical components 130a-130g utilize bond wires 132 electrically connected between substrate 120 and electromagnetic shielding layer 170. A top end of stem portion 132b is exposed from encapsulant 138 within trench 146 or individual openings 148. Trench 146 is filled with conductive paste 150. Shielding layer 170 is formed over the SIP module and electrically connected to bond wires 132 by reflowing conductive paste 150. In particular, a stem portion 132b of bond wire 132 is electrically connected to shielding layer 170 with conductive paste. The use of trench 146 or openings 148 and conductive paste 150 eliminates the need to grind the top surface of encapsulant 138.

Figure 4A:
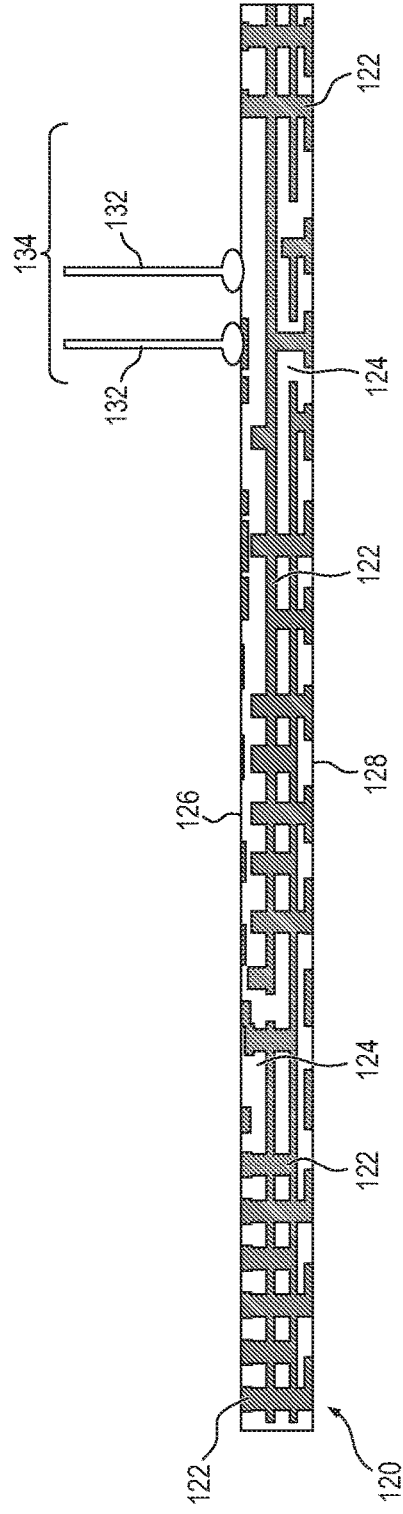
Figure 4B:
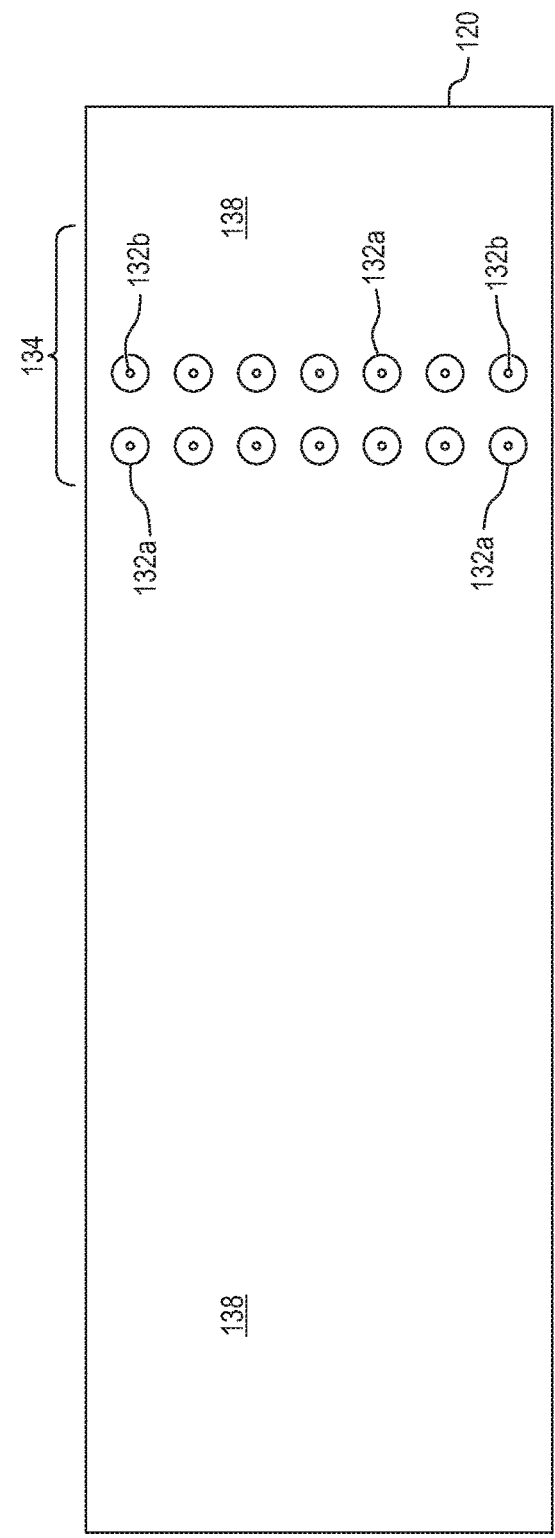
Figure 4C:
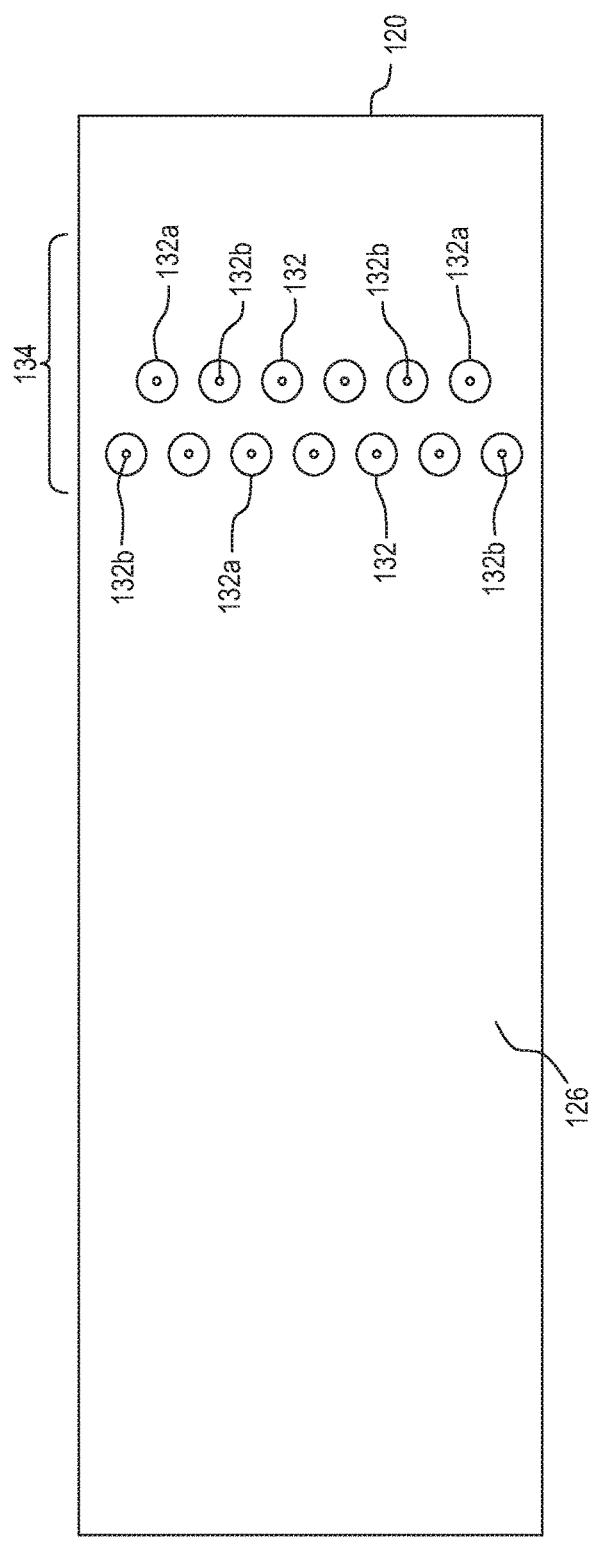
Figure 4D:
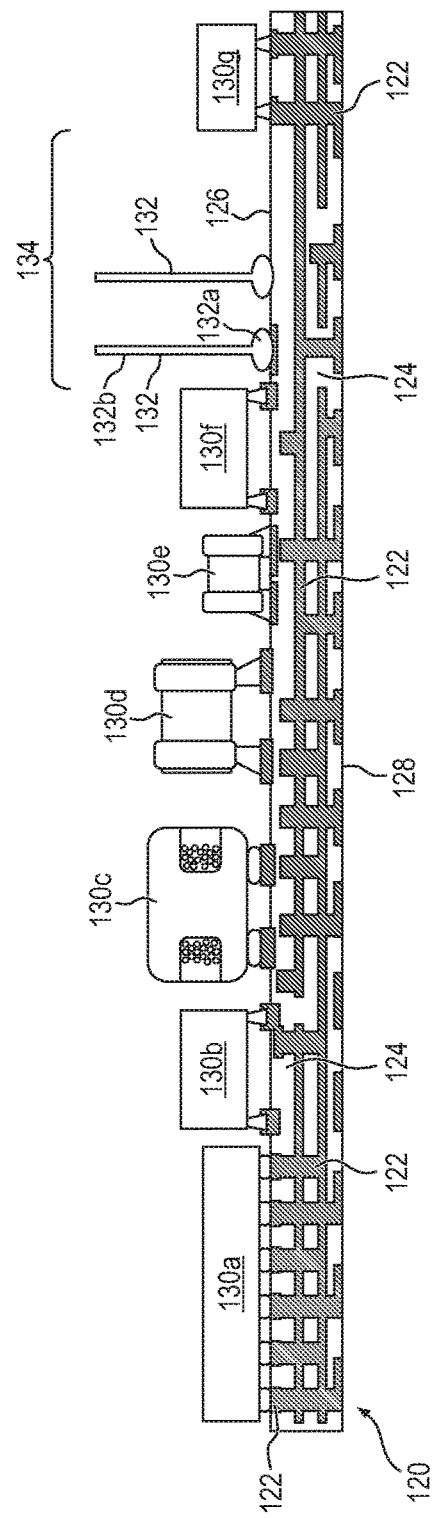

In another embodiment, the layout of bond wires 132 can have a variety of patterns. For example, a plurality of rows (2 or more) of bond wires 132 is formed within bond wire attach area 134 on substrate 120 prior to mounting electrical components 130a-130g, as shown in FIG. 4a. Elements having a similar function as described in FIGS. 2a-2m are assigned the same reference number. FIGS. 4b-4c are orthogonal views of a plurality of rows of bond wires 132 formed within bond wire attach area 134 on surface 126 of substrate 120 prior to mounting electrical components 130a-130g. The individual bond wires 132 can be aligned between rows, as shown in FIG. 4b, or offset between rows, as shown in FIG. 4c. In FIG. 4d, electrical components 130a-130g are mounted after forming the multiple rows of bond wires 132, resulting in an interim SIP module similar to FIG. 2c.

Figure 4E:
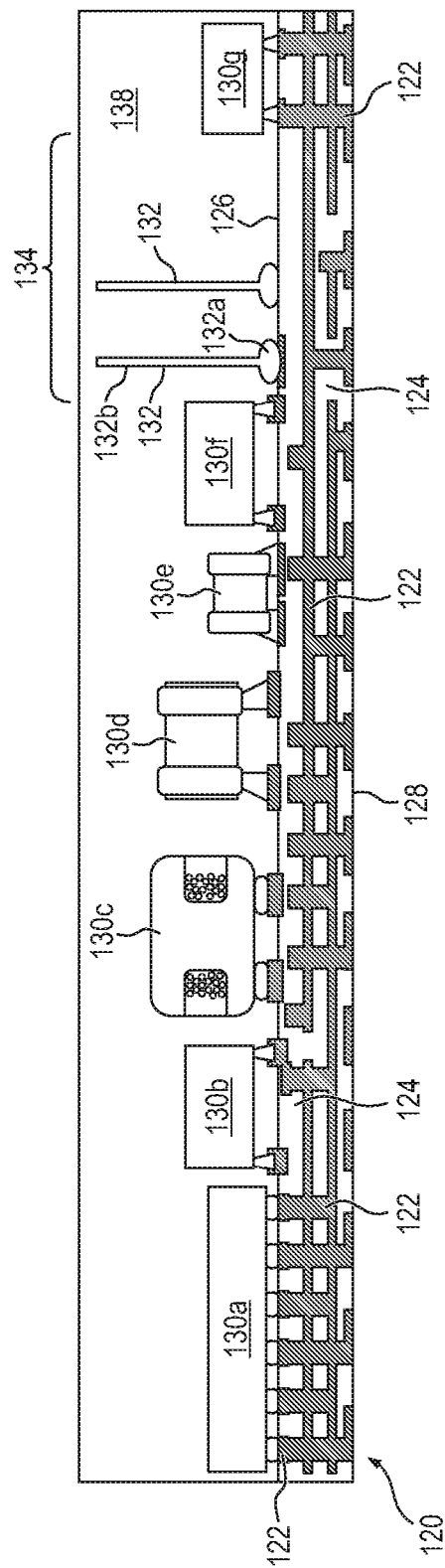

In FIG. 4e, an encapsulant or molding compound 138 is deposited over electric components 130a-103g, bond wires 132, and substrate 120 using a paste printing, compressive molding, transfer molding, liquid encapsulant molding, vacuum lamination, spin coating, or other suitable applicator. Encapsulant 138 can be polymer composite material, such as epoxy resin with filler, epoxy acrylate with filler, or polymer with proper filler. Encapsulant 138 is non-conductive, provides structural support, and environmentally protects the semiconductor device from external elements and contaminants. In particular, encapsulant 138 is deposited over electric components 130a-103g, bond wires 132, and substrate 120 after bonding the bond wires and electrical components to the substrate. Encapsulant 138 is deposited with a sufficient thickness to cover the multiple rows of bond wires 132.

Figure 4F:
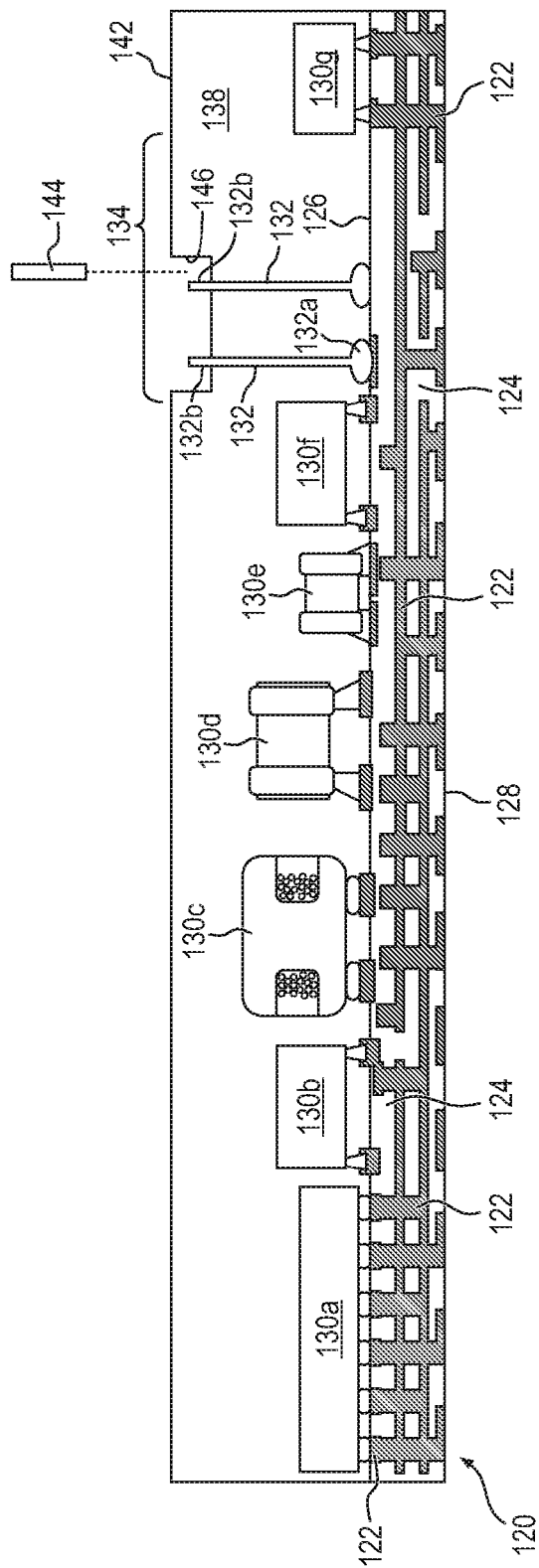

In FIG. 4f, a portion of encapsulant 138 is removed by an etching process, mechanical sawing, or LDA using laser 144 to form trench 146 extending substantially across or completely across substrate 120. The depth of trench 146 is sufficient to expose the side surface of the multiple rows of stem portions 132b. Trench 146 can have vertical or beveled side surfaces. FIG. 4g shows an orthogonal view of encapsulant 138 with trench 146 exposing multiple rows of stem portions 132b of bond wires 132. In another embodiment, individual openings 148 are formed over each stem portion 138b of bond wire 132 by LDA, as seen in FIG. 4h.

Figure 4I:
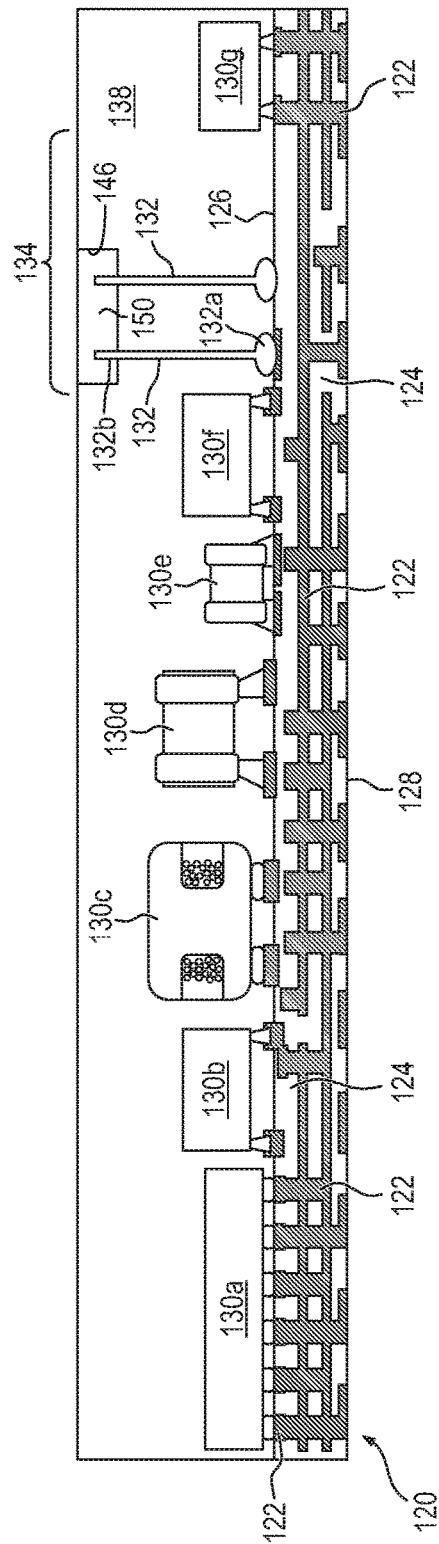
Figure 4J:
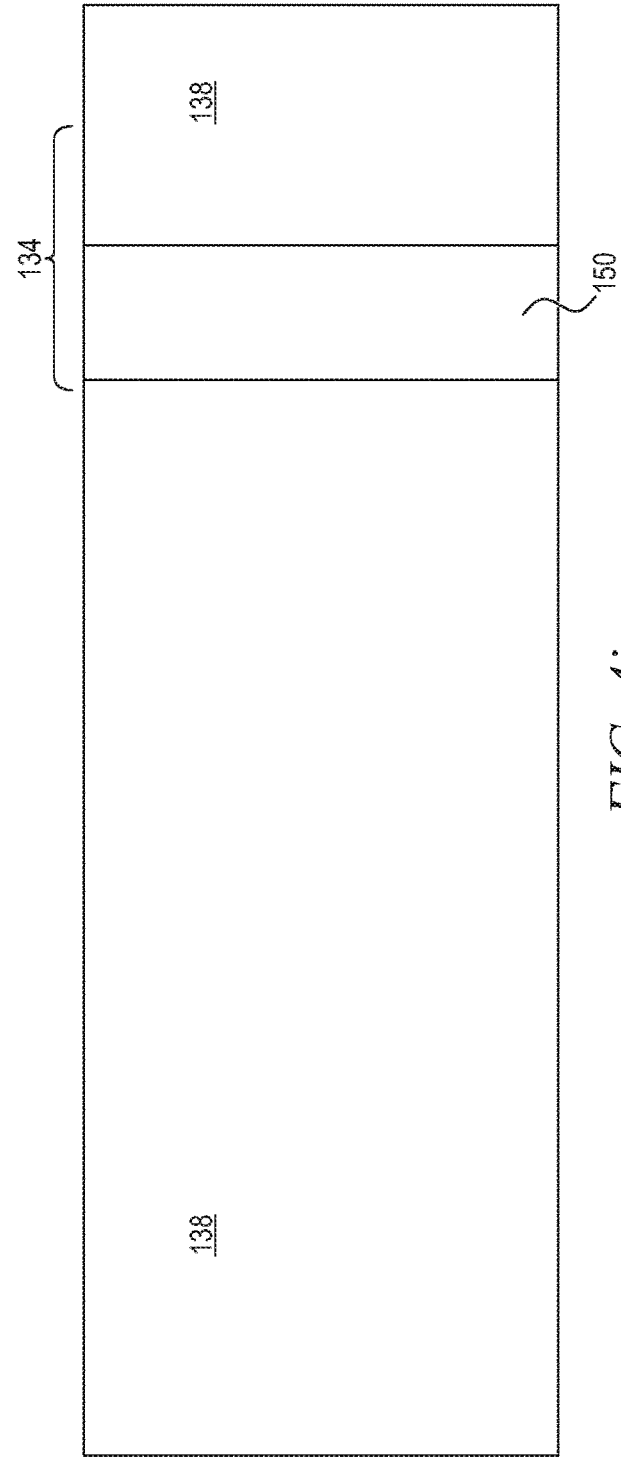

In FIG. 4i, conductive paste 150 is deposited into trench 146 made sufficient wide to expose the rows of bond wires. FIG. 4j shows an orthogonal view of conductive paste 150 in trench 146 extending substantially across or completely across substrate 120 with sufficient width to expose the multiple rows of stem portions 132b. The side surface of stem portion 132b extends above trench 146 to expose more of the stem portion for additional electrical contact surface area of the side surfaces of the stem portion. Alternatively, conductive paste 150 is deposited into the individual openings 148 to contact the individual stem portions 132b in the multiple rows of bond wires 132, as shown in FIG. 4k.

Figure 5:
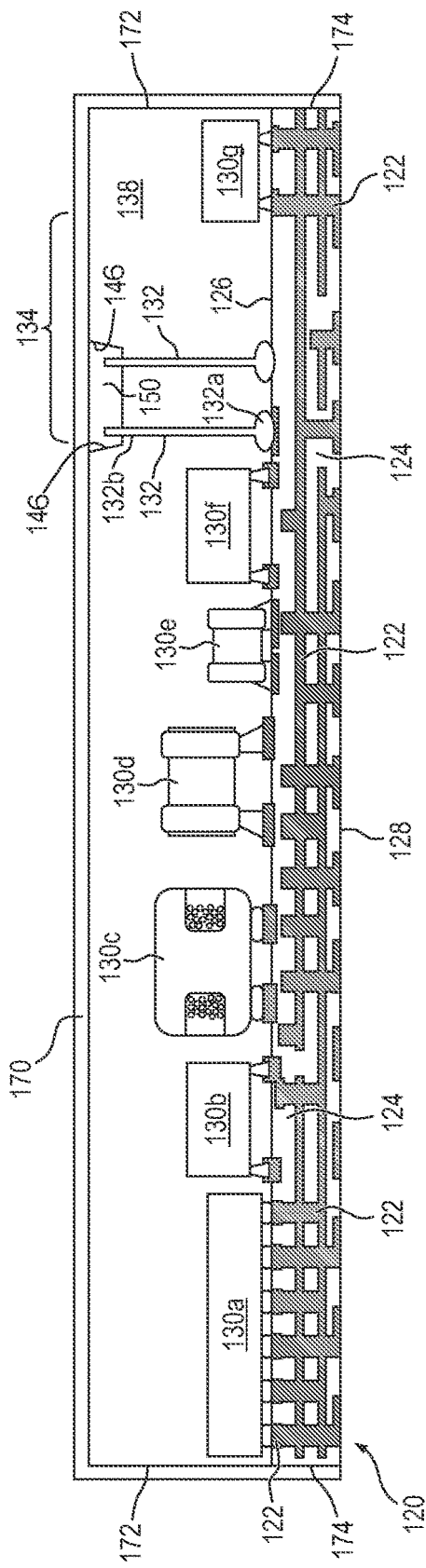
FIG. 5 illustrates another SIP module with a shielding layer in contact with rows of bond wires disposed between electrical components.

Continuing from FIG. 4i, an electromagnetic shielding layer 170 is formed over surface 142 of encapsulant 138 and conductive paste 150 within trench 146, as shown in FIG. 5. Shielding layer 170 can be one or more layers of Al, Cu, Sn, Ni, Au, Ag, or other suitable conductive material. Alternatively, shielding layer 170 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference. Conductive paste 150 is reflowed to make electrical connection between shielding layer 170 and bond wire 132. In particular, shielding layer 170 makes electrical contact to bond wire 132 for an external ground. In addition, shielding layer 170 covers side surfaces 172 of encapsulant 138 and side surfaces 174 of substrate 120.

Figure 6:
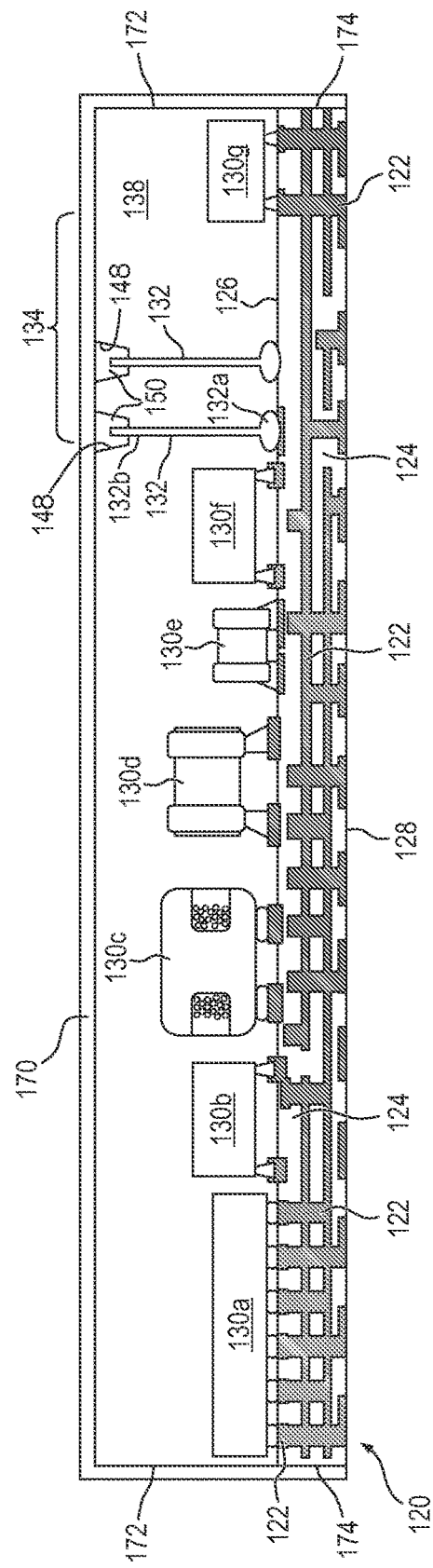
FIG. 6 illustrates another SIP module with a shielding layer in contact with rows of bond wires disposed between electrical components.

Continuing from FIG. 4k, an electromagnetic shielding layer 170 is formed over surface 142 of encapsulant 138 and conductive paste 150 within individual openings 148, as shown in FIG. 6. Shielding layer 170 can be one or more layers of Al, Cu, Sn, Ni, Au, Ag, or other suitable conductive material. Alternatively, shielding layer 170 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference. Conductive paste 150 is reflowed to make electrical connection between shielding layer 170 and bond wire 132. In particular, shielding layer 170 uses trench 146 or openings 148 and conductive paste 150 to make electrical contact to bond wire 132 for an external ground. In addition, shielding layer 170 covers side surfaces 172 of encapsulant 138 and side surfaces 174 of substrate 120.

Figure 7A:
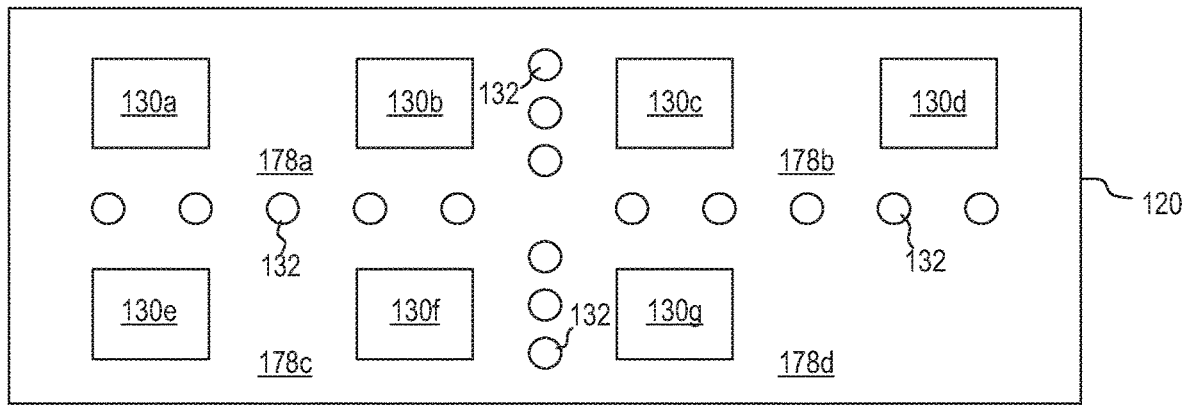
FIGS. 7a-7d illustrate other patterns of bond wires disposed between electrical components in an SIP module.
Figure 7B:
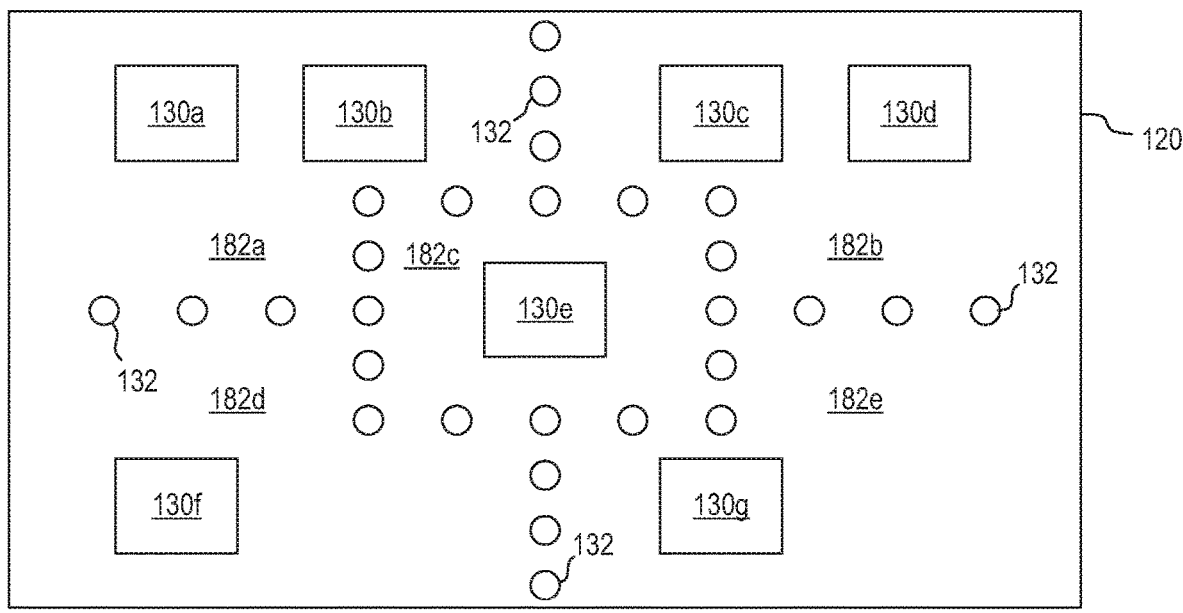
Figure 7C:
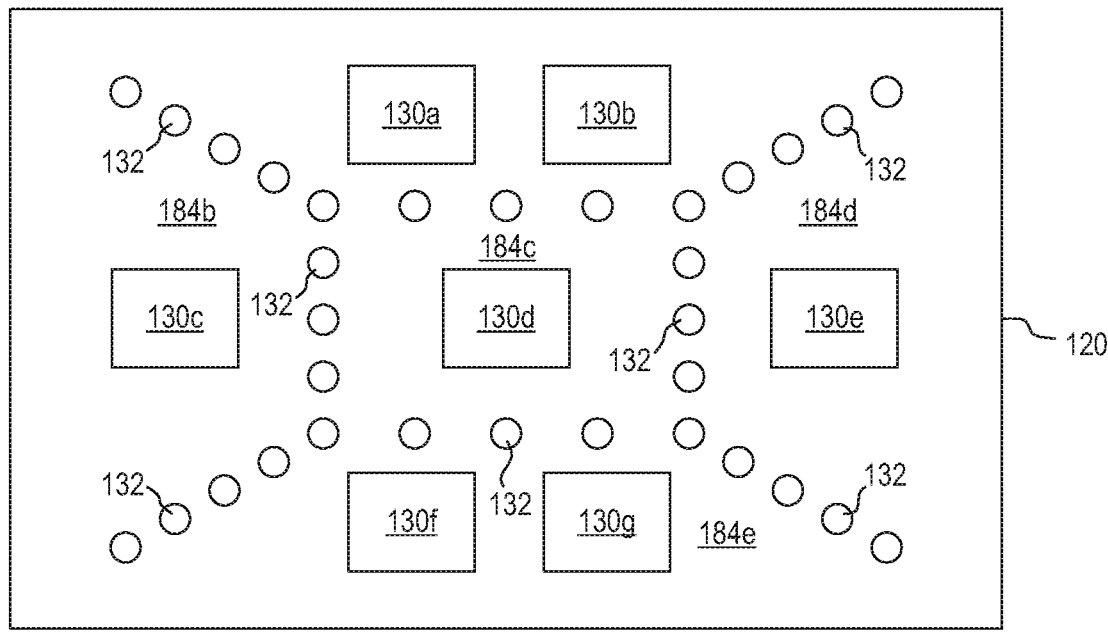
Figure 7D:
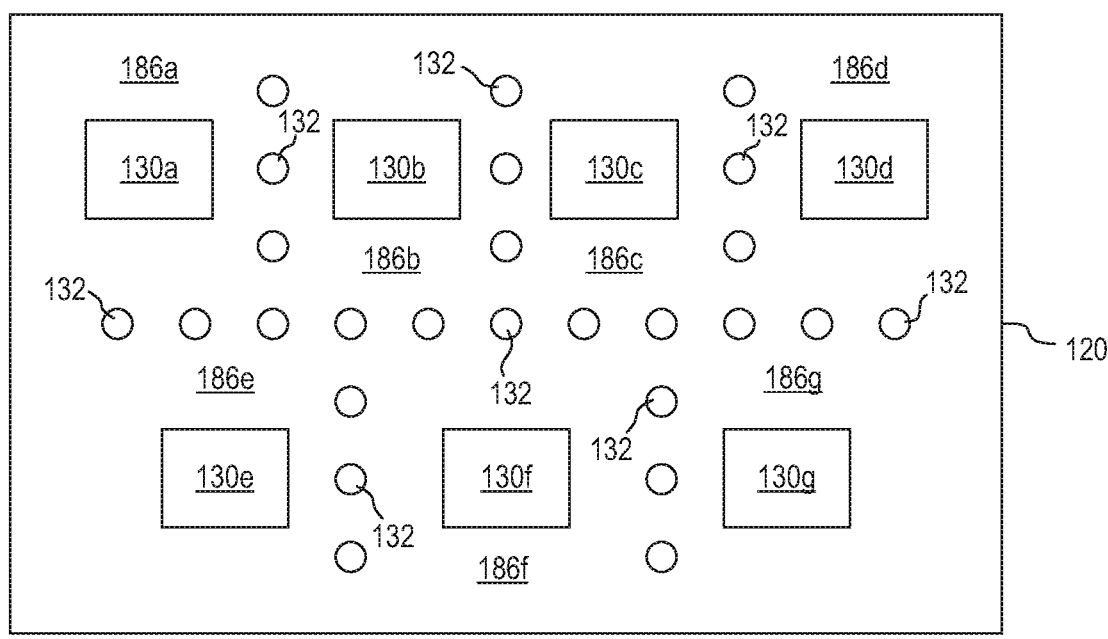

FIGS. 7a-7d illustrates additional layouts of bond wires 132 arranged to compartmentalize one or more electric components 130a-130g. In FIG. 7a, bond wires 132 are arranged to provide four compartments 178a, 178b, 178c, and 178d in which to dispose one or more electronic components 130a-130g. In FIG. 7b, bond wires 132 are arranged in an inner square with outside dividers to provide five compartments 182a, 182b, 182c, 182d, and 182e in which to dispose one or more electronic components 130a-130g. In FIG. 7c, bond wires 132 are arranged in an inner square with outside diagonal dividers to provide five compartments 184a, 184b, 184c, 184d, and 184e in which to dispose electronic components 130a-130g. In FIG. 7d, bond wires 132 are arranged to provide individual compartments 186a, 186b, 186c, 186d, 186e, and 186f in which to dispose one or more electronic components 130a-130g. The combination of bond wires 132 and shielding layer 170 compartmentalize electric elements 103a-130g for electrical isolation to reduce the influence of EMI, RFI, and other inter-device interference.

Figure 8A:
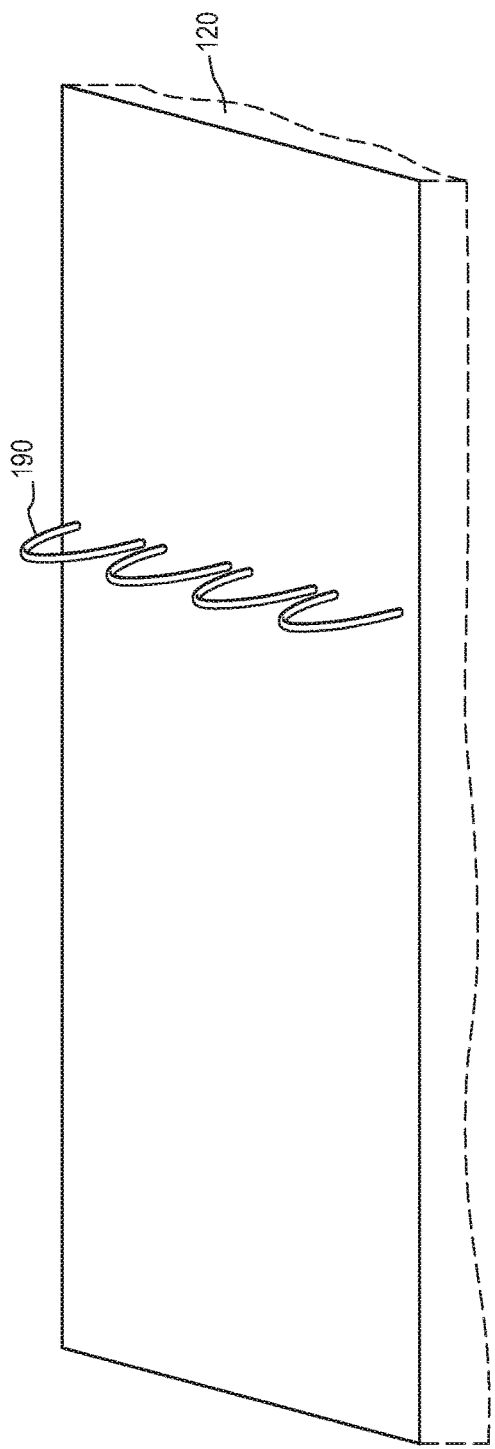
FIGS. 8a-8b illustrate another SIP module with a shielding layer in contact with rows of bond wire loops disposed between electrical components.
Figure 8B:
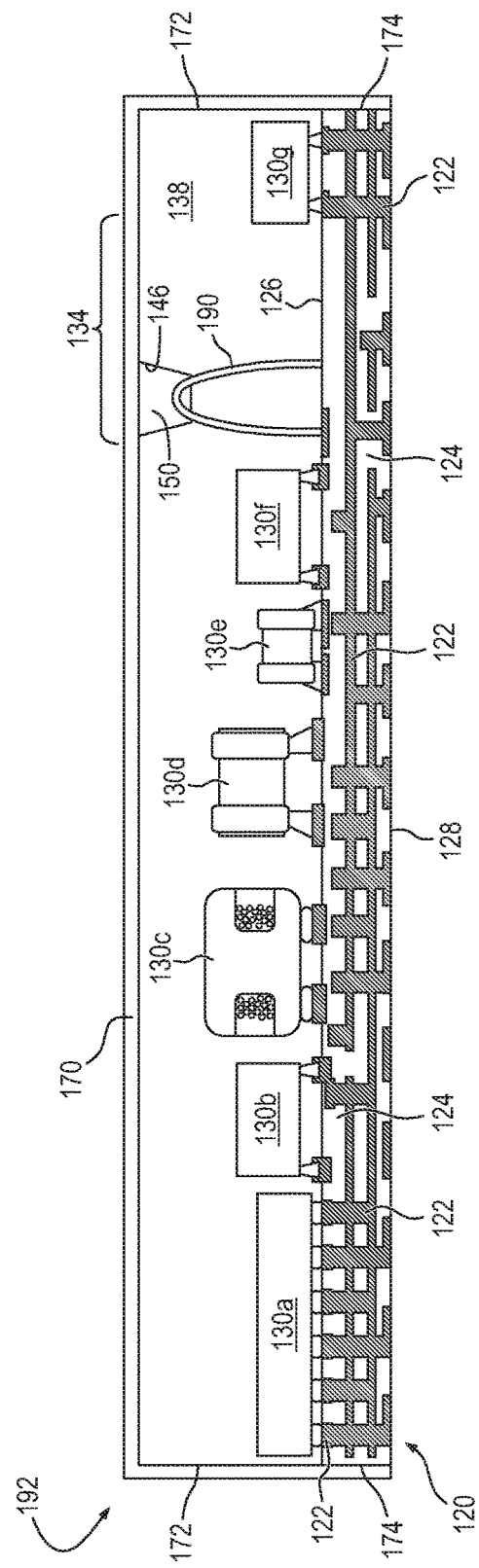

FIG. 8a-8b illustrate another embodiment with bond wire loops 190 formed over substrate 120. In FIG. 8a, bond wire loops 190 make electrical contact at both ends of the loop with conductive layer 122 on substrate 120. In FIG. 8b, electrical components 130a-130g are mounted to substrate, as described in FIG. 2c. Encapsulant 138 is deposited over electrical components 130a-130g, bond wire loops 190, and substrate 120, as described in FIG. 2f. Trench 146 is formed in encapsulant 138 to expose bond wire loops 190, as described in FIGS. 2g-2i. Conductive paste 150 is deposited in trench 146, as described in FIG. 2j. Shielding layer 170 is formed over encapsulant 138 and conductive paste 150 within trench 146, as described in FIG. 2m. Conductive paste 150 is reflowed to make electrical connection between shielding layer 170 and bond wire loops 190. In particular, shielding layer 170 uses trench 146 or openings 148 and conductive paste 150 to make electrical contact to bond wire loops 190 for an external ground.

Figure 9A:
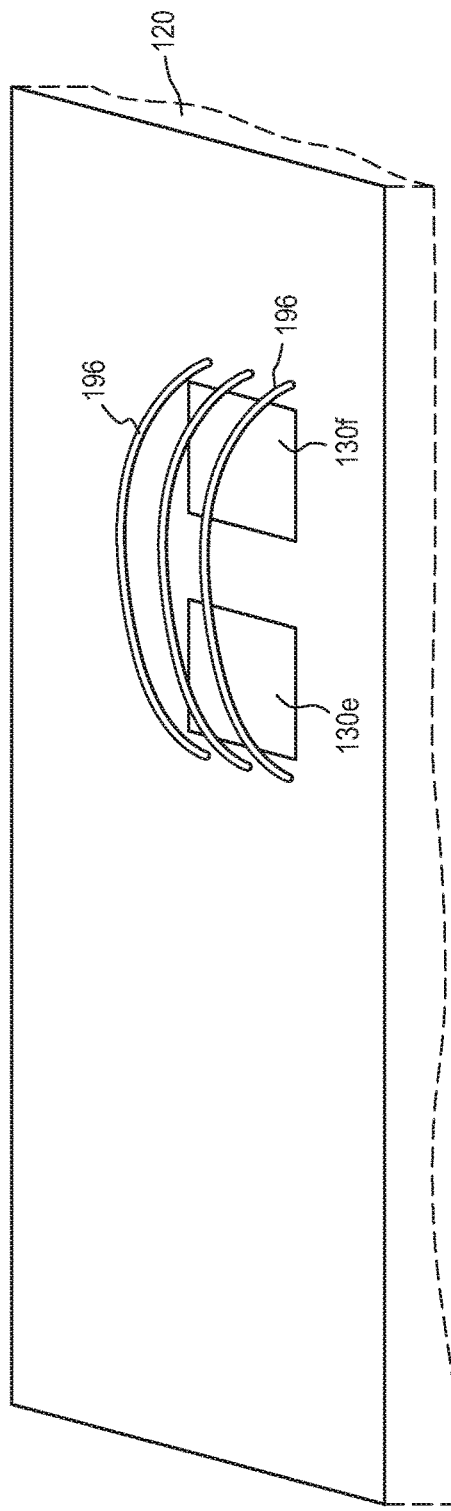
FIGS. 9a-9b illustrate another SIP module with a shielding layer in contact with rows of bond wire loops disposed over electrical components.
Figure 9B:
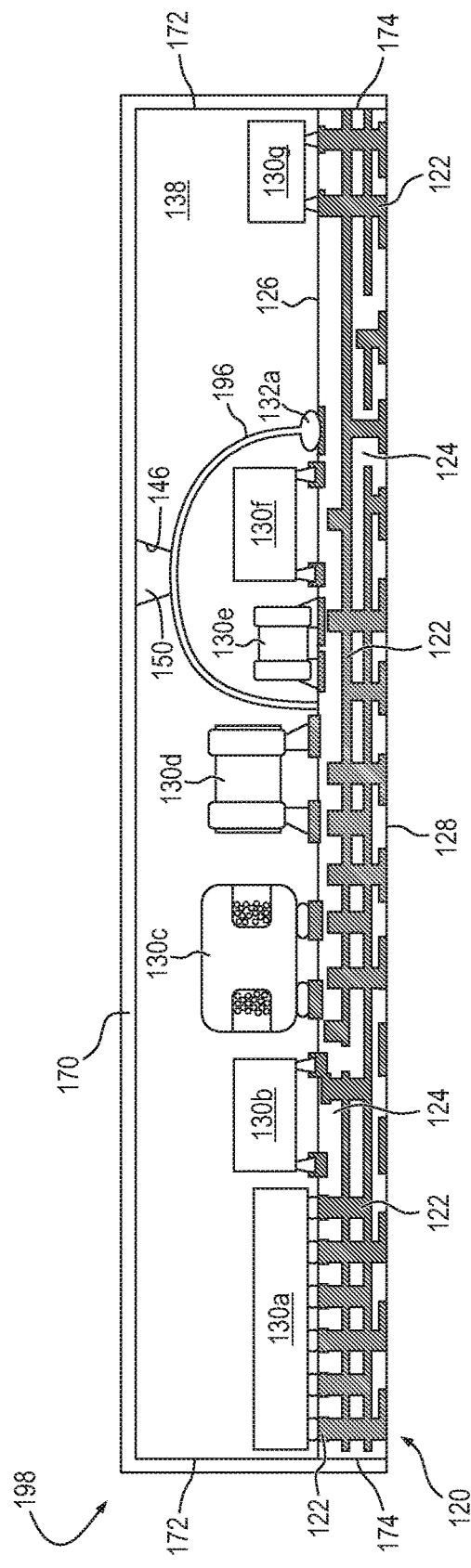

FIG. 9a-9b illustrate another embodiment with bond wire loops 196 formed over electrical components 130e-130f on substrate 120. In FIG. 9a, bond wire loops 196 extend over electrical components 130e-130f and make electrical contact at both ends of the loop with conductive layer 122 on substrate 120. In FIG. 9b, electrical components 130a-130g are mounted to substrate, as described in FIG. 2c. Encapsulant 138 is deposited over electrical components 130a-130g, bond wire loops 196, and substrate 120, as described in FIG. 2f. Trench 146 is formed in encapsulant 138 to expose bond wire loops 196, as described in FIGS. 2g-2i. Conductive paste 150 is deposited in trench 146, as described in FIG. 2j. Shielding layer 170 is formed over encapsulant 138 and conductive paste 150 within trench 146, as described in FIG. 2m. Conductive paste 150 is reflowed to make electrical connection between shielding layer 170 and bond wire loops 196. In particular, shielding layer 170 makes electrical contact to bond wire loops 196 for an external ground.

SIP module 192 from FIG. 8b and SIP module 198 from FIG. 9b contain electrical components 130a-130g utilize bond wires 132 electrically connected between substrate 120 and electromagnetic shielding layer 170. A top portion of bond wire loops 190 or 196 is exposed from encapsulant 138 with trench 146. Trench 146 is filled with conductive paste 150. Shielding layer 170 is formed over the SIP module and electrically connected to bond wire loops 190 or 196 by reflowing conductive paste 150. In particular, a top of bond wire loop 190 or 196 is electrically connected to shielding layer 170 with conductive paste. The use of trench 146 or openings 148 and conductive paste 150 eliminates the need to grind encapsulant 138.

Figure 10:
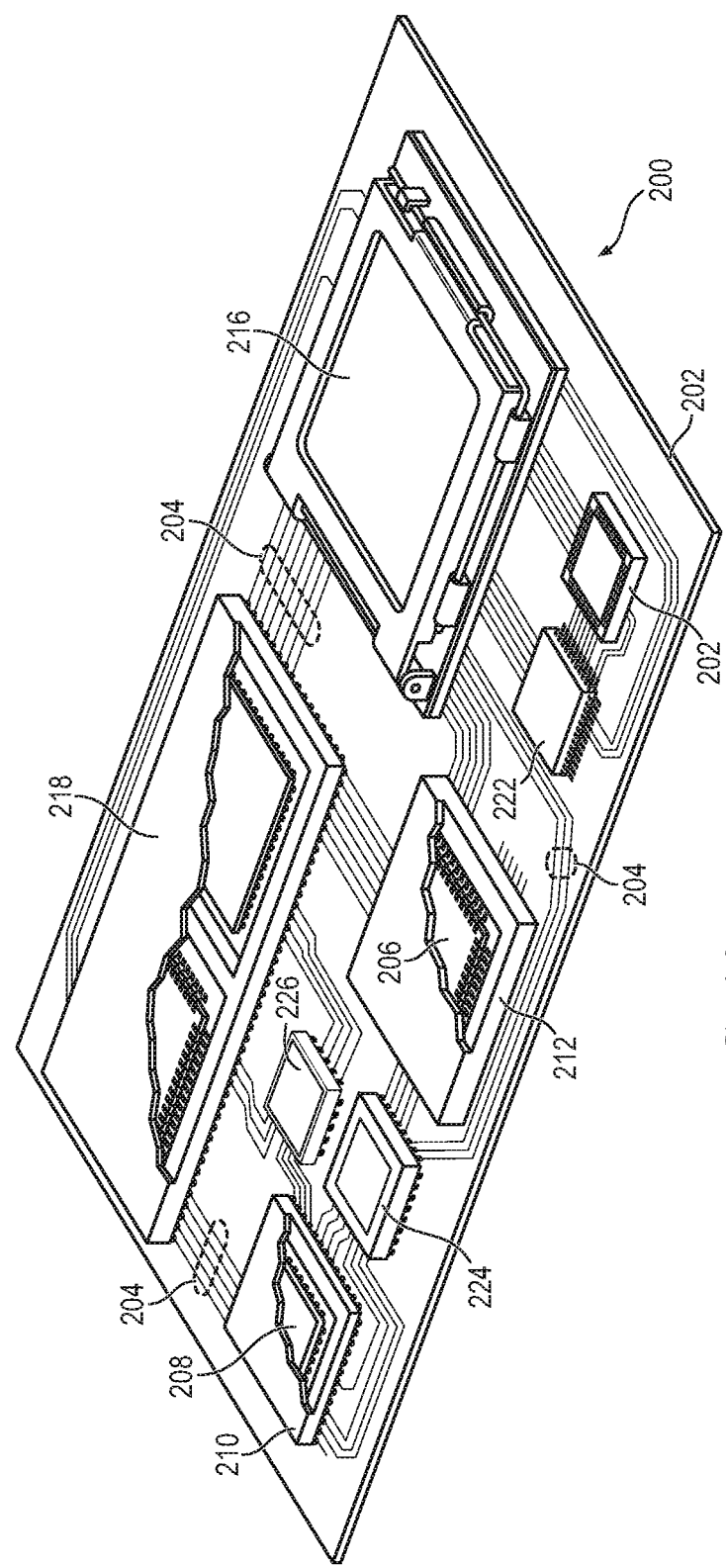
FIG. 10 illustrates a printed circuit board (PCB) with different types of packages mounted to a surface of the PCB.

FIG. 10 illustrates electronic device 200 having a chip carrier substrate or PCB 202 with a plurality of semiconductor packages mounted on a surface of PCB 202, including SIP modules 176, 192, and 198. Electronic device 200 can have one type of semiconductor package, or multiple types of semiconductor packages, depending on the application.

Electronic device 200 can be a stand-alone system that uses the semiconductor packages to perform one or more electrical functions. Alternatively, electronic device 200 can be a subcomponent of a larger system. For example, electronic device 200 can be part of a tablet, cellular phone, digital camera, communication system, or other electronic device. Alternatively, electronic device 200 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 10, PCB 202 provides a general substrate for structural support and electrical interconnect of the semiconductor packages mounted on the PCB. Conductive signal traces 204 are formed over a surface or within layers of PCB 202 using evaporation, electrolytic plating, electroless plating, screen printing, or other suitable metal deposition process. Signal traces 204 provide for electrical communication between each of the semiconductor packages, mounted components, and other external system components. Traces 204 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 206 and flipchip 208, are shown on PCB 202. Additionally, several types of second level packaging, including ball grid array (BGA) 210, bump chip carrier (BCC) 212, land grid array (LGA) 216, multi-chip module (MCM) 218, quad flat non-leaded package (QFN) 220, quad flat package 222, embedded wafer level ball grid array (eWLB) 224, and wafer level chip scale package (WLCSP) 226 are shown mounted on PCB 202. In one embodiment, eWLB 224 is a fan-out wafer level package (Fo-WLP) and WLCSP 226 is a fan-in wafer level package (Fi-WLP). Depending upon the system requirements, any combination of semiconductor packages, configured with any combination of first and second level packaging styles, as well as other electronic components, can be connected to PCB 202. In some embodiments, electronic device 200 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   disposing a bond wire including a bulbous portion on the substrate with a stem extending from the bulbous portion;
   disposing an electrical component over the substrate;
   depositing an encapsulant over the substrate, electrical component, and bond wire;
   forming an opening in the encapsulant extending below a surface of the encapsulant to a distal end of the stem of the bond wire; and
   disposing a conductive material in the opening.

2. The method of claim 1, further including forming a shielding layer over the encapsulant and in contact with the conductive material.

3. The method of claim 1, further including disposing a plurality of bond wires arranged in a pattern across the substrate.

4. The method of claim 3, wherein the pattern includes a plurality of rows of bond wires.

5. The method of claim 1, wherein the opening includes a trench extending across a plurality of bond wires disposed on the substrate.

6. The method of claim 1, further including forming a plurality of openings individually exposing each of a plurality of bond wires.

7. A method of making a semiconductor device, comprising:
   providing a substrate;
   disposing a bond wire including a bulbous portion on the substrate with a stem extending from the bulbous portion;
   depositing an encapsulant over the substrate and bond wire;
   forming an opening in the encapsulant extending to the stem of the bond wire; and
   disposing a conductive material in the opening.

8. The method of claim 7, further including:
   disposing an electrical component over the substrate; and
   forming a shielding layer over the encapsulant and in contact with the conductive material.

9. The method of claim 7, further including disposing a plurality of bond wires arranged in a pattern across the substrate.

10. The method of claim 9, wherein the pattern includes a plurality of rows of bond wires.

11. The method of claim 7, wherein the opening includes a trench extending across a plurality of bond wires disposed on the substrate.

12. The method of claim 7, wherein the opening includes a beveled side surface.

13. The method of claim 7, further including forming a plurality of openings individually exposing each of a plurality of bond wires.

14. A semiconductor device, comprising:
   a substrate;
   a bond wire including a bulbous portion disposed on the substrate and stem extending from the bulbous portion;
   an electrical component disposed over the substrate;
   an encapsulant deposited over the substrate, electrical component, and bond wire with an opening in the encapsulant extending below a surface of the encapsulant to a distal end of the stem of the bond wire; and
   a conductive material deposited in the opening.

15. The semiconductor device of claim 14, further including a shielding layer formed over the encapsulant and in contact with the conductive material.

16. The semiconductor device of claim 14, further including a plurality of bond wires arranged in a pattern across the substrate.

17. The semiconductor device of claim 14, wherein the opening includes a trench extending across a plurality of bond wires disposed on the substrate.

18. The semiconductor device of claim 14, further including a plurality of openings individually exposing each of a plurality of bond wires.

19. A semiconductor device, comprising:
   a substrate;
   a bond wire including a bulbous portion disposed on the substrate and stem extending from the bulbous portion;

an encapsulant deposited over the substrate and bond wire with an opening in the encapsulant extending to the stem of the bond wire; and a conductive material disposed in the opening.

20. The semiconductor device of claim 19, further including:

an electrical component disposed over the substrate; and a shielding layer formed over the encapsulant and in contact with the conductive material.

21. The semiconductor device of claim 19, further including a plurality of bond wires arranged in a pattern across the substrate.

22. The semiconductor device of claim 19, wherein the opening includes a trench extending across a plurality of bond wires disposed on the substrate.

23. The semiconductor device of claim 19, further including a plurality of openings individually exposing each of a plurality of bond wires.

\* \* \* \* \*